United States Patent
Kim

(10) Patent No.: US 12,336,292 B2
(45) Date of Patent: Jun. 17, 2025

(54) DISPLAY DEVICE AND METHOD OF MANUFACTURING THE SAME

(71) Applicant: Samsung Display Co., LTD., Yongin-si (KR)

(72) Inventor: Keunwoo Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/746,472

(22) Filed: Jun. 18, 2024

(65) Prior Publication Data

US 2025/0126893 A1 Apr. 17, 2025

(30) Foreign Application Priority Data

Oct. 11, 2023 (KR) .................. 10-2023-0135496

(51) Int. Cl.
G09G 3/32 (2016.01)
H10D 86/01 (2025.01)
H10D 86/40 (2025.01)
H10D 86/60 (2025.01)

(52) U.S. Cl.
CPC ............... *H10D 86/60* (2025.01); *G09G 3/32* (2013.01); *H10D 86/0231* (2025.01); *H10D 86/451* (2025.01); G09G 2300/0819 (2013.01); G09G 2300/0842 (2013.01); G09G 2300/0861 (2013.01); *H10D 86/423* (2025.01)

(58) Field of Classification Search
CPC .. H10D 86/60; H10D 86/0231; H10D 86/451; H10D 86/423; G09G 3/32; G09G 2300/0819; G09G 2300/0842; G09G 2300/0861
See application file for complete search history.

(56) References Cited

U.S. PATENT DOCUMENTS

| 10,482,817 | B2 | 11/2019 | Kim et al. | |
|---|---|---|---|---|
| 11,355,647 | B2 | 6/2022 | Hu et al. | |
| 2012/0211751 | A1* | 8/2012 | Kim | H10D 86/60 257/E33.053 |
| 2015/0129844 | A1* | 5/2015 | Kang | H10D 62/117 257/43 |
| 2016/0064465 | A1* | 3/2016 | Oh | H10D 30/6731 345/212 |
| 2016/0343878 | A1* | 11/2016 | Kwon | H01L 21/02592 |
| 2018/0190676 | A1 | 7/2018 | Lv et al. | |

FOREIGN PATENT DOCUMENTS

| CN | 108154846 A | 6/2018 |
|---|---|---|
| KR | 1020140102151 A | 8/2014 |
| KR | 102566551 B1 | 8/2023 |

* cited by examiner

*Primary Examiner* — Pegeman Karimi
(74) *Attorney, Agent, or Firm* — CANTOR COLBURN LLP

(57) ABSTRACT

A display device includes a pixel and a driver electrically connected to the pixel. The driver may include first oxide semiconductor layer including a first source area, a first drain area, and a first channel area disposed between the first source area and the first drain area. The driver may include a first gate electrode disposed on the first oxide semiconductor layer and overlapping the first channel area of the first oxide semiconductor layer in a plan view. The driver may include a first charge layer disposed between the first gate electrode and the first oxide semiconductor layer and overlapping at least a portion of the first channel area in a plan view.

20 Claims, 13 Drawing Sheets

DISPLAY DEVICE AND METHOD OF MANUFACTURING THE SAME

This application claims priority to Korean Patent Application No. 10-2023-0135496, filed on Oct. 11, 2023, and all the benefits accruing therefrom under 35 U.S.C. § 119, the content of which in its entirety is herein incorporated by reference.

BACKGROUND

1. Field

Embodiments relate to a display device and a method of manufacturing the display device. More particularly, embodiments relate to a display device including an oxide semiconductor and a method of manufacturing the display device including the oxide semiconductor.

2. Description of the Related Art

A display device may include a display area and a driver. The driver may generate a driving signal and provide the driving signal to the display area. The driver may include a transistor to generate the driving signal. A silicon semiconductor (amorphous silicon, polycrystalline silicon, or the like) or an oxide semiconductor may be used as a semiconductor layer of the transistor.

Recently, in order to simplify a circuit structure of the driver and reduce power consumption, a driver with a complementary metal-oxide-semiconductor (CMOS) structure including a transistor including a silicon semiconductor and a transistor including an oxide semiconductor has been developed.

SUMMARY

Embodiments provide a display device including a transistor with improved reliability. Embodiments provide a method of manufacturing the display device.

A display device according to an embodiment includes a pixel and a driver electrically connected to the pixel.

In an embodiment, the driver may include first oxide semiconductor layer including a first source area, a first drain area, and a first channel area disposed between the first source area and the first drain area, a first gate electrode disposed on the first oxide semiconductor layer and overlapping the first channel area of the first oxide semiconductor layer in a plan view, and a first charge layer disposed between the first gate electrode and the first oxide semiconductor layer and overlapping at least a portion of the first channel area in a plan view.

In an embodiment, the first charge layer may be disposed adjacent to the first source area of the first oxide semiconductor layer.

In an embodiment, the display device may further include a first insulating layer covering the first oxide semiconductor layer.

In an embodiment, the first charge layer may be disposed in the first insulating layer.

In an embodiment, the first charge layer may be disposed such that the first charge layer is spaced apart from the first oxide semiconductor layer with a portion of the first insulating layer interposed between the first charge layer and the first oxide semiconductor layer.

In an embodiment, the first source area of the first oxide semiconductor layer and the first drain area of the first oxide semiconductor layer may be spaced apart from each other in a first direction with the first channel area of the first oxide semiconductor layer interposed between the first source area and the first drain area.

In an embodiment, a width of the first charge layer in the first direction may be less than or equal to half of a width of the first channel area of the first oxide semiconductor layer in the first direction.

In an embodiment, a width of the first charge layer in the first direction may be greater than a width of the first channel area of the first oxide semiconductor layer in the first direction.

In an embodiment, the first oxide semiconductor layer may include an n-type semiconductor.

In an embodiment, the first charge layer may include negatively charged particles.

In an embodiment, the display device may further include a first source electrode disposed on the first gate electrode, connected to the first source area of the first oxide semiconductor layer, and inputted with a signal, and a first drain electrode disposed on the first gate electrode, connected to the first drain area of the first oxide semiconductor layer, and spaced apart from the first source electrode.

In an embodiment, the signal may be output to the first drain electrode.

In an embodiment, the pixel may include a pixel circuit.

In an embodiment, the pixel circuit may include a second oxide semiconductor layer including a second source area, a second drain area, and a second channel area disposed between the second source area and the second drain area, a second gate electrode disposed on the second oxide semiconductor layer and overlapping the second channel area of the second oxide semiconductor layer in a plan view, and a second charge layer disposed between the second gate electrode and the second oxide semiconductor layer and overlapping at least a portion of the second channel area of the second oxide semiconductor layer in a plan view.

In an embodiment, the second charge layer may be disposed adjacent to the second source area of the second oxide semiconductor layer.

In an embodiment, the display device may further include a second insulating layer covering the second oxide semiconductor layer.

In an embodiment, the second charge layer may be disposed in the second insulating layer.

In an embodiment, the second source area of the second oxide semiconductor layer and the second drain area of the second oxide semiconductor layer may be spaced apart from each other in a first direction with the second channel area of the second oxide semiconductor layer interposed between the second source area and the second drain area.

In an embodiment, a width of the second charge layer in the first direction may be less than or equal to half of a width of the second channel area of the second oxide semiconductor layer in the first direction.

In an embodiment, the driver may be a gate driver coupled to the pixel and configured to provide a gate signal to the pixel.

In an embodiment, the driver may be an emission driver coupled to the pixel and configured to provide an emission signal to the pixel.

A method of manufacturing a display device according to an embodiment includes forming a driver electrically connected to a pixel.

In an embodiment, the forming the driver may include forming an oxide semiconductor layer including a source area, a drain area, and a channel area disposed between the source area and the drain area on a substrate, forming an insulating layer covering the oxide semiconductor layer, forming a charge layer overlapping at least a portion of the channel area of the oxide semiconductor layer in a plan view in the insulating layer, and forming a gate electrode disposed on the insulating layer and overlapping the channel area of the oxide semiconductor layer in a plan view.

In an embodiment, the forming the charge layer may include injecting ions into the insulating layer using a mask.

In an embodiment, the injecting of the ions may include selectively injecting the ions into a portion of the insulating layer overlapping the channel area of the oxide semiconductor layer in a plan view and adjacent to the source area of the oxide semiconductor layer using the mask.

In an embodiment, an energy of the ions injected into the insulating layer may range from 5 kV to 10 kV, and an injection amount of the ions injected into the insulating layer may range from $3e11$ ions/cm$^2$ to $3e12$ ions/cm$^2$.

In an embodiment, the charge layer may be formed such that the charge layer is spaced apart from the oxide semiconductor layer with a portion of the insulating layer interposed between the charge layer and the oxide semiconductor layer.

A display device according to an embodiment includes a pixel and a driver electrically connected to the pixel, and the driver may include first oxide semiconductor layer including a first source area, a first drain area, and a first channel area disposed between the first source area and the first drain area, a first gate electrode disposed on the first oxide semiconductor layer and overlapping the first channel area of the first oxide semiconductor layer in a plan view, and a first charge layer disposed between the first gate electrode and the first oxide semiconductor layer and overlapping at least a portion of the first channel area in a plan view That is, the first charge layer may be disposed between the first oxide semiconductor layer and the first gate electrode. Accordingly, a threshold voltage of a transistor included in the driver may be shifted in a positive direction. Accordingly, embodiments of the present disclosure support preventing a phenomenon in which the transistor is turned on when a signal value lower than a specific signal value is provided to the first gate electrode.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
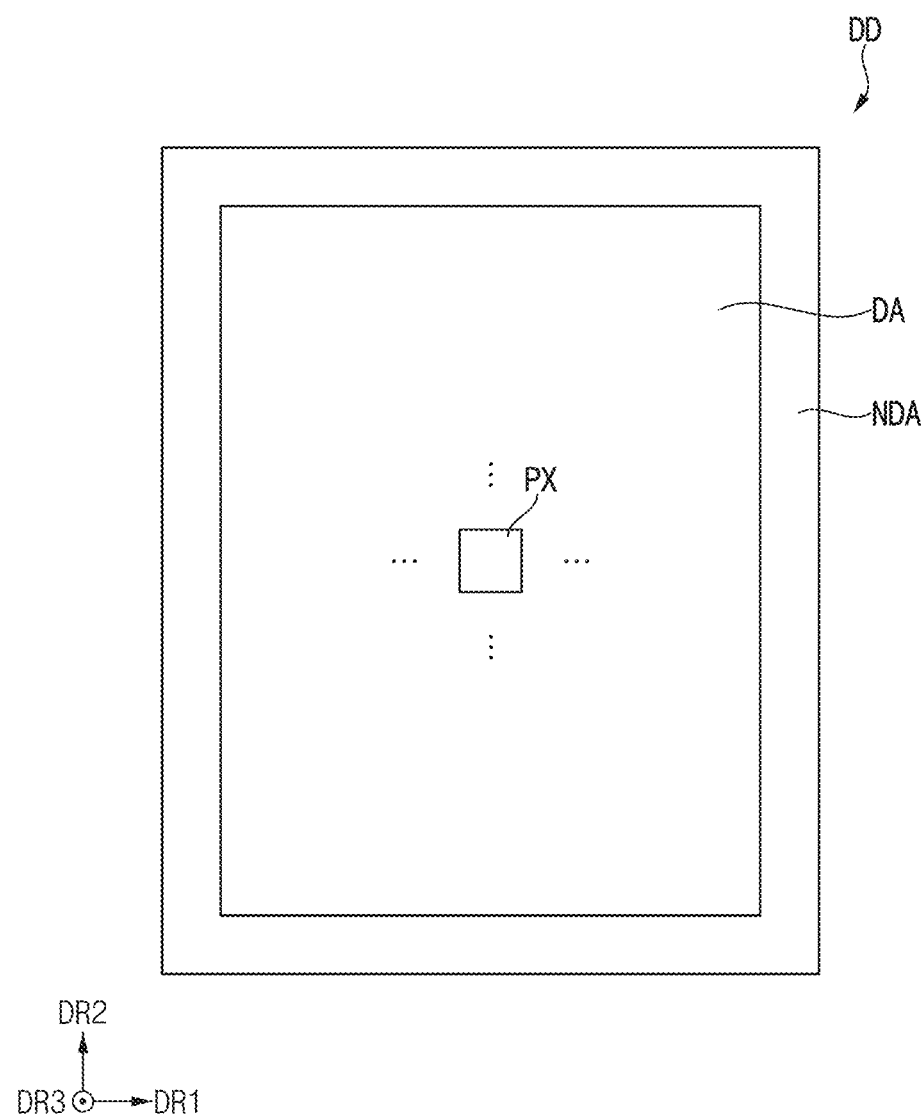
FIG. 1 is a plan view illustrating a display device in accordance with one or more embodiments of the present disclosure.

Hereinafter, display devices in accordance with embodiments will be described in more detail with reference to the accompanying drawings. The same reference numerals are used for the same components in the drawings, and redundant descriptions of the same components will be omitted.

Embodiments supported by the present disclosure will now be described more fully hereinafter with reference to the accompanying drawings, in which one or more example embodiments are illustrated. Aspects supported by the present disclosure may, however, be embodied in different forms and should not be construed as limited to the embodiments set forth herein. Rather, these example embodiments are provided so that this disclosure will be thorough and complete, and will fully convey the scope of example aspects of the invention to those skilled in the art.

Figure 2:
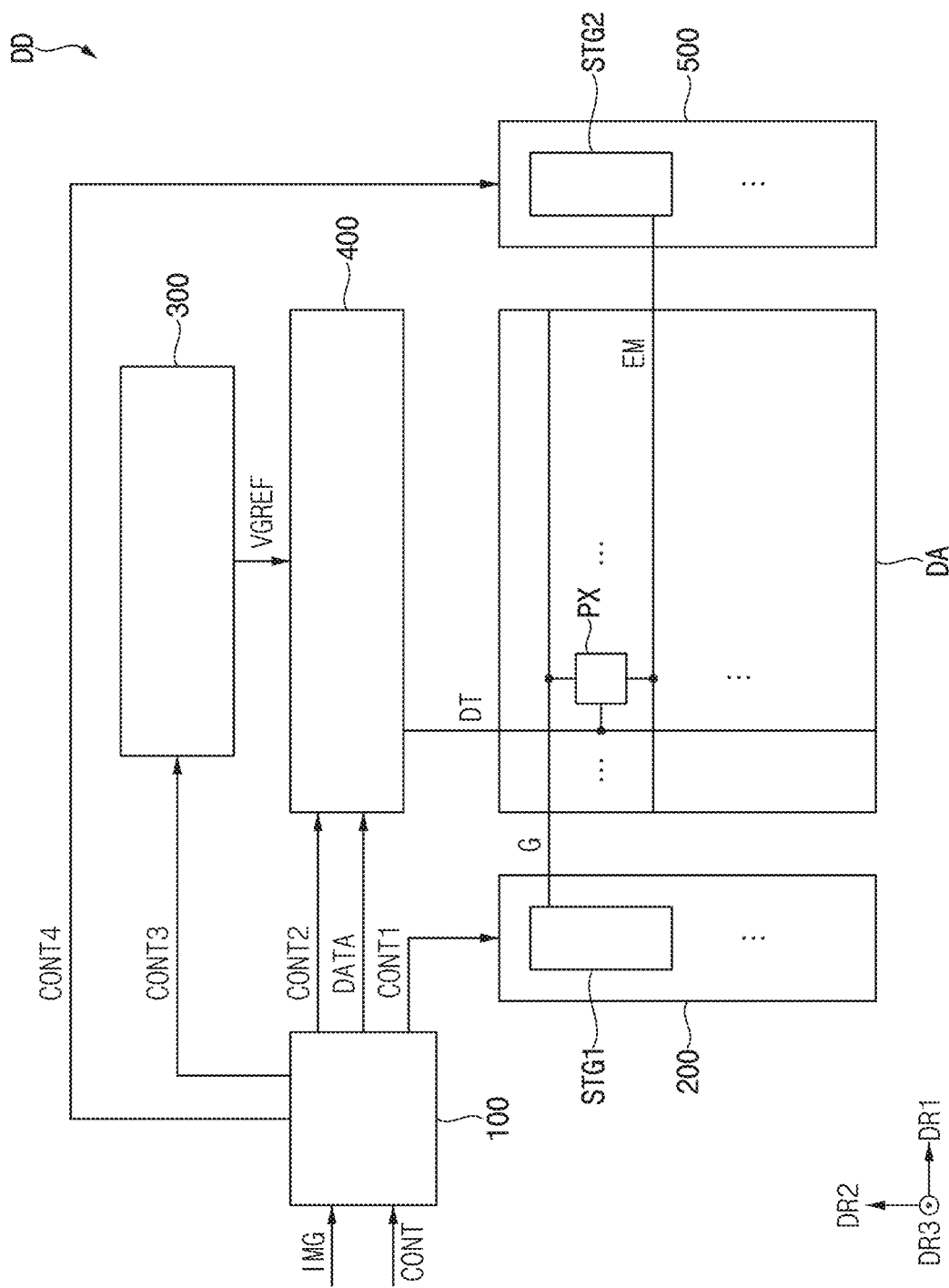
FIG. 2 is a block diagram illustrating a display device of FIG. 1 in accordance with one or more embodiments of the present disclosure.

FIG. 1 is a plan view illustrating a display device according to an embodiment. FIG. 2 is a block diagram illustrating a display device of FIG. 1 in accordance with one or more embodiments of the present disclosure.

Referring to FIG. 1, a display device DD according to an embodiment may include a display area DA and a non-display area NDA. The display area DA may be defined as an area capable of displaying an image by generating light or adjusting a transmittance of light provided from an external light source. The non-display area NDA may be an area that does not display an image. In some aspects, the non-display area NDA may surround at least a portion of the display area DA.

A plurality of pixels may be disposed in the display area DA. For example, a pixel PX may be disposed in the display area DA. The plurality of pixels may be repeatedly arranged in a first direction DR1 and a second direction DR2 crossing the first direction DR1.

Referring further to FIG. 2, a driver may be disposed in the non-display area NDA. The driver may include a driving controller 100, a gate driver 200, a gamma reference voltage generator 300, a data driver 400, and an emission driver 500. The pixel PX may be electrically connected to the gate driver 200, the data driver 400, and the emission driver 500.

The driving controller 100 may receive input image data IMG and an input control signal CONT from an external device. In an embodiment, the input image data IMG may include red image data, green image data, and blue image data. In another embodiment, the input image data IMG may include white image data. In another embodiment, the input image data IMG may include magenta image data, yellow image data, and cyan image data.

The input control signal CONT may include a master clock signal, a data enable signal, and the like. The input control signal CONT may further include a vertical synchronization signal and a horizontal synchronization signal.

The driving controller 100 may generate a first control signal CONT1, a second control signal CONT2, a third control signal CONT3, a fourth control signal CONT4, and a data signal DATA based on the input image data IMG and the input control signal CONT.

The driving controller 100 may generate the first control signal CONT1 based on the input control signal CONT. The driving controller 100 may output the first control signal CONT1 to the gate driver 200. The first control signal CONT1 may include a vertical start signal and a gate clock signal.

The driving controller 100 may generate the second control signal CONT2 based on the input control signal CONT. The driving controller 100 may output the second control signal CONT2 to the data driver 400. The second control signal CONT2 may include a horizontal start signal and a load signal.

The driving controller 100 may generate the third control signal CONT3 based on the input control signal CONT. The driving controller 100 may output the third control signal CONT3 to the gamma reference voltage generator 300.

The driving controller 100 may generate the fourth control signal CONT4 based on the input control signal CONT. The driving controller 100 may output the fourth control signal CONT4 to the emission driver 500.

The driving controller 100 may generate a data signal DATA based on the input image data IMG. The driving controller 100 may output the data signal DATA to the data driver 400.

The gate driver 200 may generate a gate signal G in response to the first control signal CONT1 received from the driving controller 100. The gate driver 200 may transmit the gate signal G to the plurality of pixels. For example, the gate driver 200 may transmit the gate signal G to the pixel PX.

Figure 3:
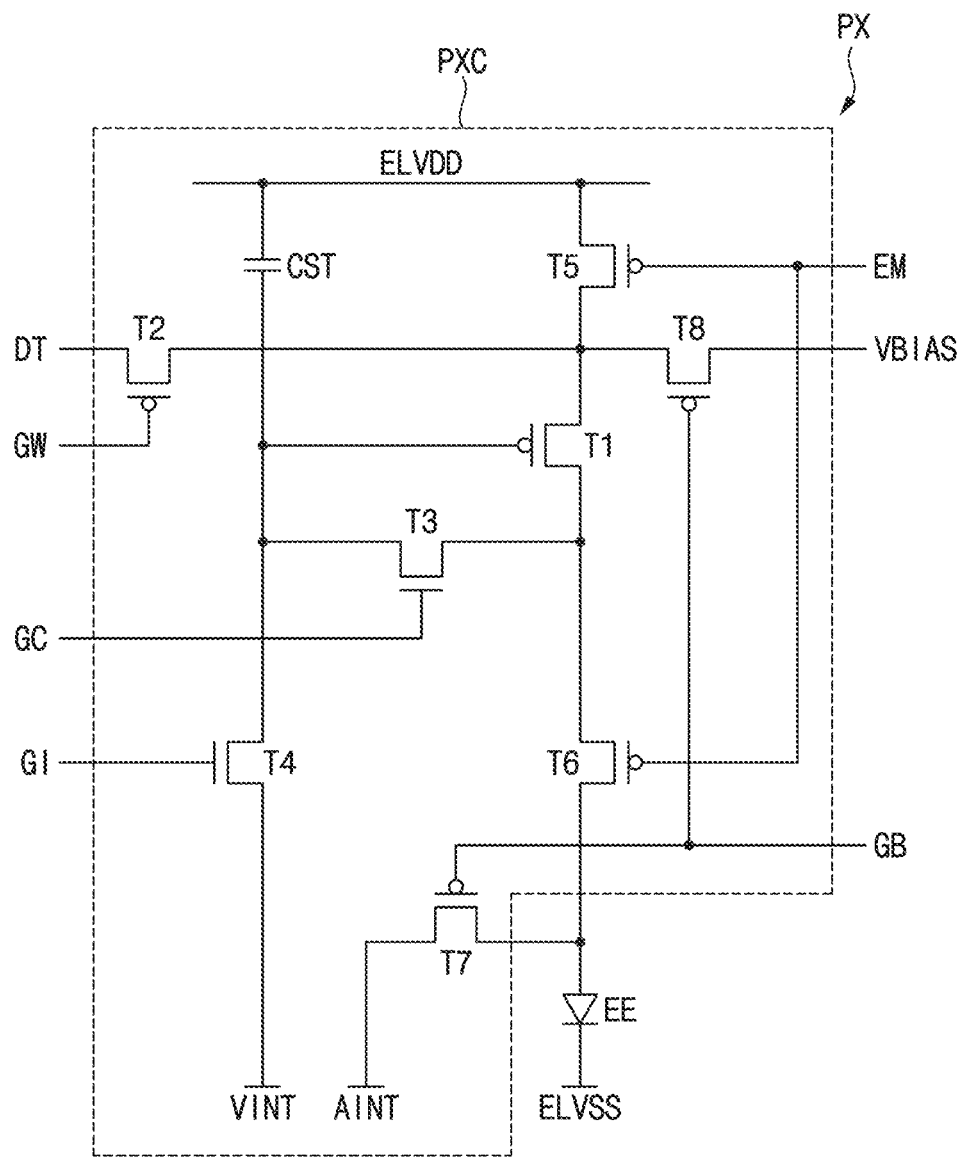
FIG. 3 is a circuit diagram for describing a pixel included in the display device of FIG. 1 in accordance with one or more embodiments of the present disclosure.

In an example, the gate signal G may include a gate compensation signal (e.g., a gate compensation signal GC in FIG. 3), a gate bias signal (e.g., a gate bias signal GB in FIG. 3), a gate initialization signal (e.g., a gate initialization signal GI in FIG. 3), and a gate write signal (e.g., a gate write signal GW in FIG. 3).

In an example, the gate driver 200 may include first stages STG1. The first stages STG1 may sequentially output a gate signal G. In an embodiment, each of the first stages STG1 may output a gate signal G to the plurality of pixels. For example, each of the first stages STG1 may output a gate signal G to the pixel PX.

FIG. 2 illustrates an example in which the display device DD includes one gate driver 200. However, embodiments of the present disclosure are not limited thereto. For example, the display device DD may include multiple gate drivers. In an example, the display device DD may include a first gate driver and a second gate driver. The first gate driver may transmit the gate compensation signal to the pixel PX. In some aspects, the second gate driver may provide the gate bias signal to the pixel PX.

The gamma reference voltage generator 300 may generate a gamma reference voltage VGREF in response to the third control signal CONT3 received from the driving controller 100. The gamma reference voltage generator 300 may provide the gamma reference voltage VGREF to the data driver 400. The gamma reference voltage VGREF may have a value corresponding to the data signal DATA. In some examples, the driving controller 100 may generate multiple data signals DATA, and the gamma reference voltage VGREF may have a value corresponding to each of the data signals DATA.

In an embodiment, the gamma reference voltage generator 300 may be spaced apart from or separate from the data driver 400. In another embodiment, the gamma reference voltage generator 300 may be integrated with the driving controller 100. For example, the gamma reference voltage generator 300 may be disposed in the driving controller 100. In another embodiment, the gamma reference voltage generator 300 may be integrated with the data driver 400. For example, the gamma reference voltage generator 300 may be disposed in the data driver 400.

The data driver 400 may receive the second control signal CONT2 and the data signal DATA from the driving controller 100. In some aspects, the data driver 400 may receive the gamma reference voltage VGREF from the gamma reference voltage generator 300. The data driver 400 may convert the data signal DATA into an analog data voltage DT using the gamma reference voltage VGREF. The data driver 400 may transfer the data voltage DT to the plurality of pixels. For example, the data driver 400 may transfer the data voltage DT to the pixel PX.

The emission driver 500 may generate the emission control signal EM in response to the fourth control signal CONT4 received from the driving controller 100. The emission driver 500 may transmit the emission control signal EM to the plurality of pixels. For example, the emission driver 500 may transmit the emission control signal EM to the pixel PX.

In an example, the emission driver 500 may include second stages STG2. The second stages STG2 may sequentially output the emission control signal EM. In an embodiment, each of the second stages STG2 may output an emission control signal EM to the plurality of pixels. For example, each of the second stages STG2 may output an emission control signal EM to the pixel PX.

For convenience, FIG. 2 illustrates an example in which the gate driver 200 is disposed in the non-display area NDA adjacent to a first side of the display area DA, and the emission driver 500 is disposed in the non-display area NDA adjacent to a second side of the display area DA, However, embodiments of the present disclosure are not limited thereto. For example, both the gate driver 200 and the emission driver 500 may be disposed in the non-display area NDA adjacent to the first side of the display area DA. For example, the gate driver 200 and the emission driver 500 may be integrally formed.

Figure 4:
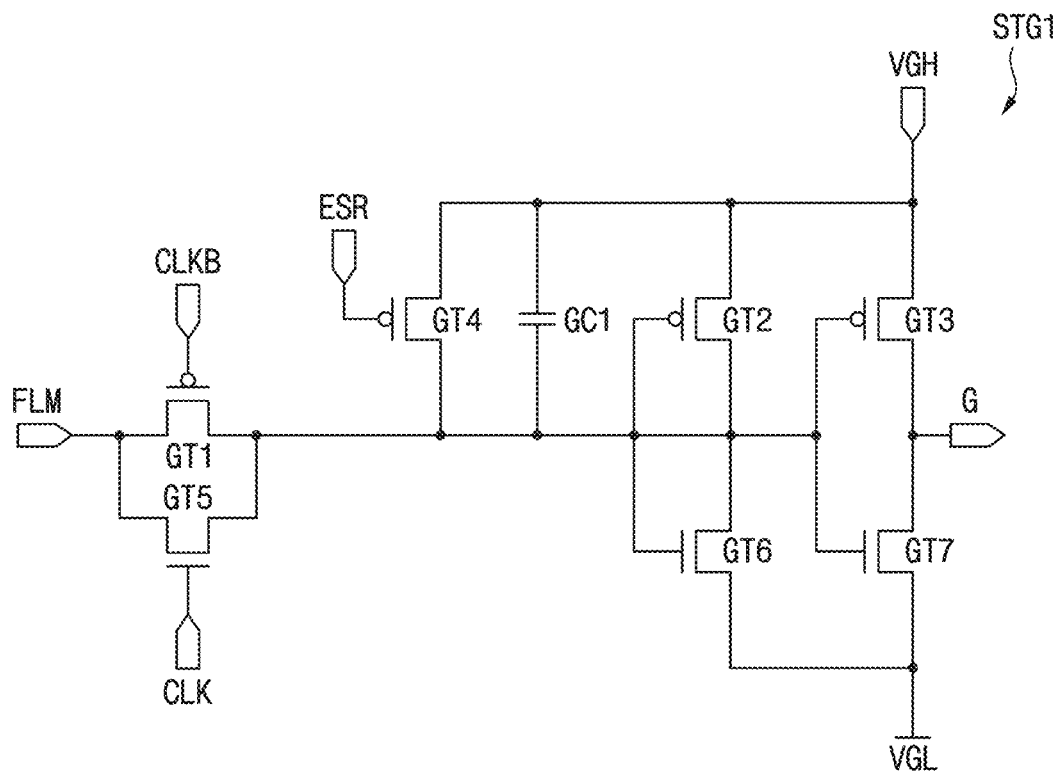
FIG. 4 is a circuit diagram for describing a gate driver included in the display device of FIG. 2 in accordance with one or more embodiments of the present disclosure.
Figure 5:
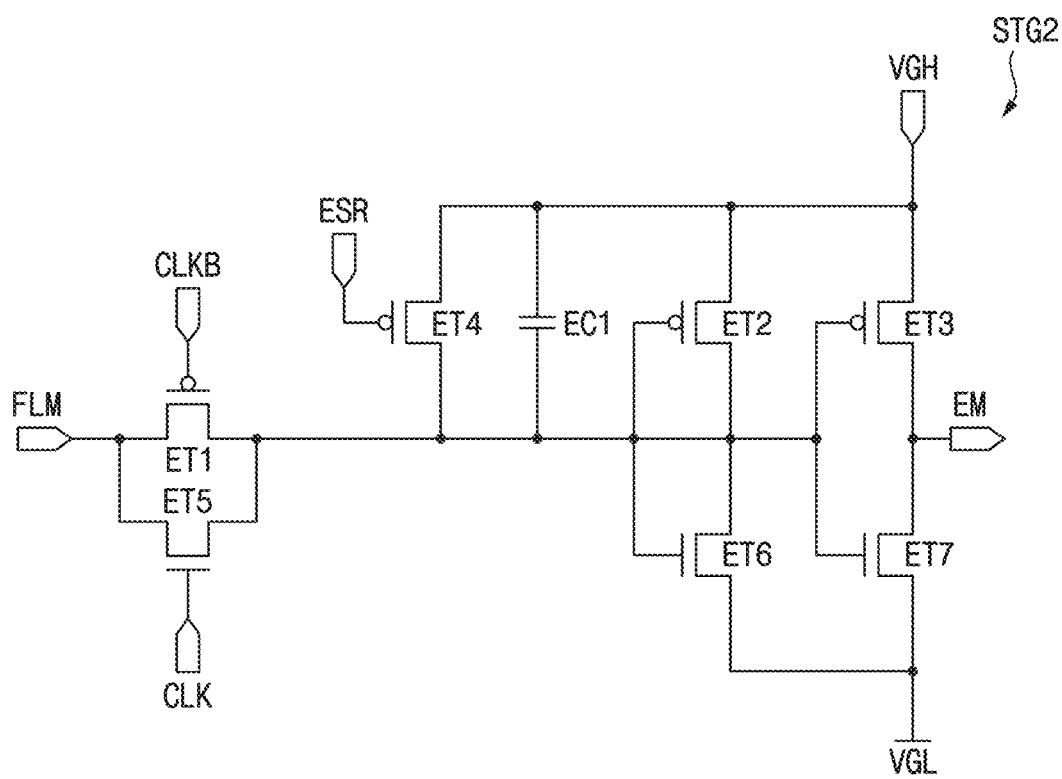
FIG. 5 is a circuit diagram for describing an emission driver included in the display device of FIG. 2 in accordance with one or more embodiments of the present disclosure.

FIG. 3 is a circuit diagram for describing a pixel included in the display device of FIG. 1 in accordance with one or more embodiments of the present disclosure. FIG. 4 is a circuit diagram for describing a gate driver included in the display device of FIG. 2 in accordance with one or more embodiments of the present disclosure. FIG. 5 is a circuit diagram for describing an emission driver included in the display device of FIG. 2 in accordance with one or more embodiments of the present disclosure.

Referring to FIG. 3, the pixel PX may include a pixel circuit PXC and a light-emitting element EE. The pixel circuit PXC may generate a driving current corresponding to the data voltage DT. The light-emitting element EE may emit light corresponding to the driving current.

The pixel circuit PXC may include a first transistor T1, a second transistor T2, a third transistor T3, a fourth transistor T4, a fifth transistor T5, a sixth transistor T6, a seventh transistor T7, an eighth transistor T8, and a storage capacitor CST.

The storage capacitor CST may include a first electrode and a second electrode. The first electrode of the storage capacitor CST may receive a first power supply voltage ELVDD. In some aspects, the second electrode of the storage capacitor CST may be connected to the first transistor T1. The storage capacitor CST may maintain a voltage level of the gate electrode of the first transistor T1 during a deactivation period of the gate write signal GW (e.g., a period during which gate write signal GW is of a negative voltage level, a voltage level associated with a logic level low, or the like). The term "connected" may be referred to an electrical coupling or an electrical connection. The term "connected" may be referred to a physical connection supportive of the electrical coupling or electrical connection.

The first transistor T1 may include a first electrode, a second electrode, and a gate electrode. The gate electrode of the first transistor T1 may be connected to the second electrode of the storage capacitor CST. The first electrode of the first transistor T1 may be connected to the second transistor T2 and may be provided with a data voltage DT. The second electrode of the first transistor T1 may be connected to the sixth transistor T6. The first transistor T1 may generate a driving current based on a voltage difference between the gate electrode and the first electrode. For example, the first transistor T1 may be referred to as a driving transistor.

The second transistor T2 may include a first electrode, a second electrode, and a gate electrode. The gate electrode of the second transistor T2 may receive the gate write signal GW.

The second transistor T2 may be turned on or off in response to the gate write signal GW. In an example in which the second transistor T2 is a PMOS transistor, the second transistor T2 may be turned off when the gate write signal GW has a positive voltage level, and may be turned on when the gate write signal GW has a negative voltage level.

The first electrode of the second transistor T2 may be provided with a data voltage DT. The second electrode of the second transistor T2 may provide a data voltage DT to the first electrode of the first transistor T1 during a period in which the second transistor T2 is turned on. For example, the second transistor T2 may be referred to as a switching transistor.

The third transistor T3 may include a first electrode, a second electrode, and a gate electrode. The gate electrode of the third transistor T3 may receive a gate compensation signal GC. The first electrode of the third transistor T3 may be connected to the gate electrode of the first transistor T1. The second electrode of the third transistor T3 may be connected to the second electrode of the first transistor T1.

The third transistor T3 may be turned on or off in response to the gate compensation signal GC. In an example in which the third transistor T3 is an NMOS transistor, the third transistor T3 may be turned on when the gate compensation signal GC has a positive voltage level and may be turned off when the gate compensation signal GC has a negative voltage level.

During a period in which the third transistor T3 is turned on in response to the gate compensation signal GC, the third transistor T3 may diode-couple the first transistor T1. Accordingly, the third transistor T3 may compensate for the threshold voltage of the first transistor T1. For example, the third transistor T3 may be referred to as a compensation transistor.

The fourth transistor T4 may include a first electrode, a second electrode, and a gate electrode. The gate electrode of the fourth transistor T4 may receive a gate initialization signal GI. The first electrode of the fourth transistor T4 may be connected to the gate electrode of the first transistor T1. The second electrode of the fourth transistor T4 may receive a gate initialization voltage VINT.

The fourth transistor T4 may be turned on or off in response to the gate initialization signal GI. In an example in which the fourth transistor T4 is an NMOS transistor, the fourth transistor T4 may be turned on when the gate initialization signal GI has a positive voltage level, and may be turned off when the gate initialization signal GI has a negative voltage level.

During a period in which the fourth transistor T4 is turned on in response to the gate initialization signal GI, the fourth transistor T4 may provide a gate initialization voltage VINT to the gate electrode of the first transistor T1. Accordingly, the fourth transistor T4 may initialize the gate electrode of the first transistor T1 to the gate initialization voltage VINT. For example, the fourth transistor T4 may be referred to as a gate initialization transistor.

The fifth transistor T5 may include a first electrode, a second electrode, and a gate electrode. The gate electrode of the fifth transistor T5 may receive an emission control signal EM. The first electrode of the fifth transistor T5 may receive a first power supply voltage ELVDD. The second electrode of the fifth transistor T5 may be connected to the first transistor T1. In an example in which the fifth transistor T5 is turned on in response to the emission control signal EM, the fifth transistor T5 may provide the first power supply voltage ELVDD to the first transistor T1.

The sixth transistor T6 may include a first electrode, a second electrode, and a gate electrode. The gate electrode of the sixth transistor T6 may receive an emission control signal EM. The first electrode of the sixth transistor T6 may be connected to the first transistor T1. The second electrode of the sixth transistor T6 may be connected to the light-emitting element EE. In an example in which the sixth transistor T6 is turned on in response to the emission control signal EM, the sixth transistor T6 may provide the driving current to the light-emitting element EE.

The seventh transistor T7 may include a first electrode, a second electrode, and a gate electrode. The gate electrode of the seventh transistor T7 may receive a gate bias signal GB. The first electrode of the seventh transistor T7 may receive an anode initialization voltage AINT. The second electrode of the seventh transistor T7 may be connected to the light-emitting element EE.

When the seventh transistor T7 is turned on in response to the gate bias signal GB, the seventh transistor T7 may provide the anode initialization voltage AINT to the light-emitting element EE. Accordingly, the seventh transistor T7 may initialize the first electrode of the light-emitting element EE to the anode initialization voltage AINT. For example, the seventh transistor T7 may be referred to as an anode initialization transistor.

The eighth transistor T8 may include a first electrode, a second electrode, and a gate electrode. The gate electrode of the eighth transistor T8 may receive a gate bias signal GB. The first electrode of the eighth transistor T8 may receive a bias voltage VBIAS. The second electrode of the eighth transistor T8 may be connected to the first electrode of the first transistor T1.

When the eighth transistor T8 is turned on in response to the gate bias signal GB, the eighth transistor T8 may transfer the bias voltage VBIAS to the first transistor T1. The bias voltage VBIAS may be 5V to 6V similar to a data voltage of a black gray scale. Accordingly, embodiments of the present disclosure support preventing deterioration of the first transistor T1 in low frequency driving.

The light-emitting element EE may include a first electrode and a second electrode. The first electrode of the light emitting-element EE may be connected to a sixth transistor T6. The second electrode of the light-emitting element EE may receive a second power supply voltage ELVSS. The light emitting-element EE may emit light corresponding to the driving current.

In an embodiment, each of the first transistor T1, the second transistor T2, the fifth transistor T5, the sixth transistor T6, the seventh transistor T7, and the eighth transistor T8 may be a PMOS transistor. In some aspects, each of the third transistor T3 and the fourth transistor T4 may be an NMOS transistor.

However, embodiments of the present disclosure are not limited thereto, and in another embodiment, each of the first transistor T1, the second transistor T2, the third transistor T3, the fourth transistor T4, the fifth transistor T5, the sixth transistor T6, the seventh transistor T7, and the eighth transistor T8 may be NMOS transistors.

Referring to FIGS. 2 and 4, the gate driver 200 may include first stages STG1. Each of the first stages STG1 may include a first gate transistor GT1, a second gate transistor GT2, a third gate transistor GT3, a fourth gate transistor GT4, a fifth gate transistor GT5, a sixth gate transistor GT6, a seventh gate transistor GT7, and a gate capacitor GC1.

Each of the first stages STG1 may receive a start signal FLM, a first clock signal CLK, a second clock signal CLKB, a high voltage VGH, a low voltage VGL, and a reset signal ESR. In some aspects, each of the first stages STG1 may output a gate signal G.

In an embodiment, each of the first gate transistor GT1, the second gate transistor GT2, the third gate transistor GT3, and the fourth gate transistor GT4 may be a PMOS transistor. In some aspects, each of the fifth gate transistor GT5, the sixth gate transistor GT6, and the seventh gate transistor GT7 may be an NMOS transistor.

However, embodiments of the present disclosure are not limited thereto, and in another embodiment, each of the first gate transistor GT1, the second gate transistor GT2, the third gate transistor GT3, the fourth gate transistor GT4, the fifth gate transistor GT5, the sixth gate transistor GT6, and the seventh gate transistor GT7 may be an NMOS transistor.

Referring to FIGS. 2 and 5, the emission driver 500 may include second stages STG2. Each of the second stages STG2 may include a first emission transistor ET1, a second emission transistor ET2, a third emission transistor ET3, a fourth emission transistor ET4, a fifth emission transistor ET5, a sixth emission transistor ET6, a seventh emission transistor ET7, and an emission capacitor EC1.

Each of the second stages STG2 may receive the start signal FLM, the first clock signal CLK, the second clock signal CLKB, the high voltage VGH, the low voltage VGL, and the reset signal ESR. In some aspects, each of the second stages STG2 may output an emission control signal EM.

In an embodiment, each of the first emission transistor ET1, the second emission transistor ET2, the third emission transistor ET3, and the fourth emission transistor ET4 may be a PMOS transistor. In some aspects, each of the fifth emission transistor ET5, the sixth emission transistor ET6, and the seventh emission transistor ET7 may be an NMOS transistor.

However, embodiments of the present disclosure are not limited thereto, and in another embodiment, each of the first emission transistor ET1, the second emission transistor ET2, the third emission transistor ET3, the fourth emission transistor ET4, the fifth emission transistor ET5, the sixth emission transistor ET6, and the seventh emission transistor ET7 may be an NMOS transistor.

In an embodiment, the first stages STG1 and the second stages STG2 may have substantially the same circuit structure. In another embodiment, the first stages STG1 and the second stages STG2 may have different circuit structures.

Figure 6:
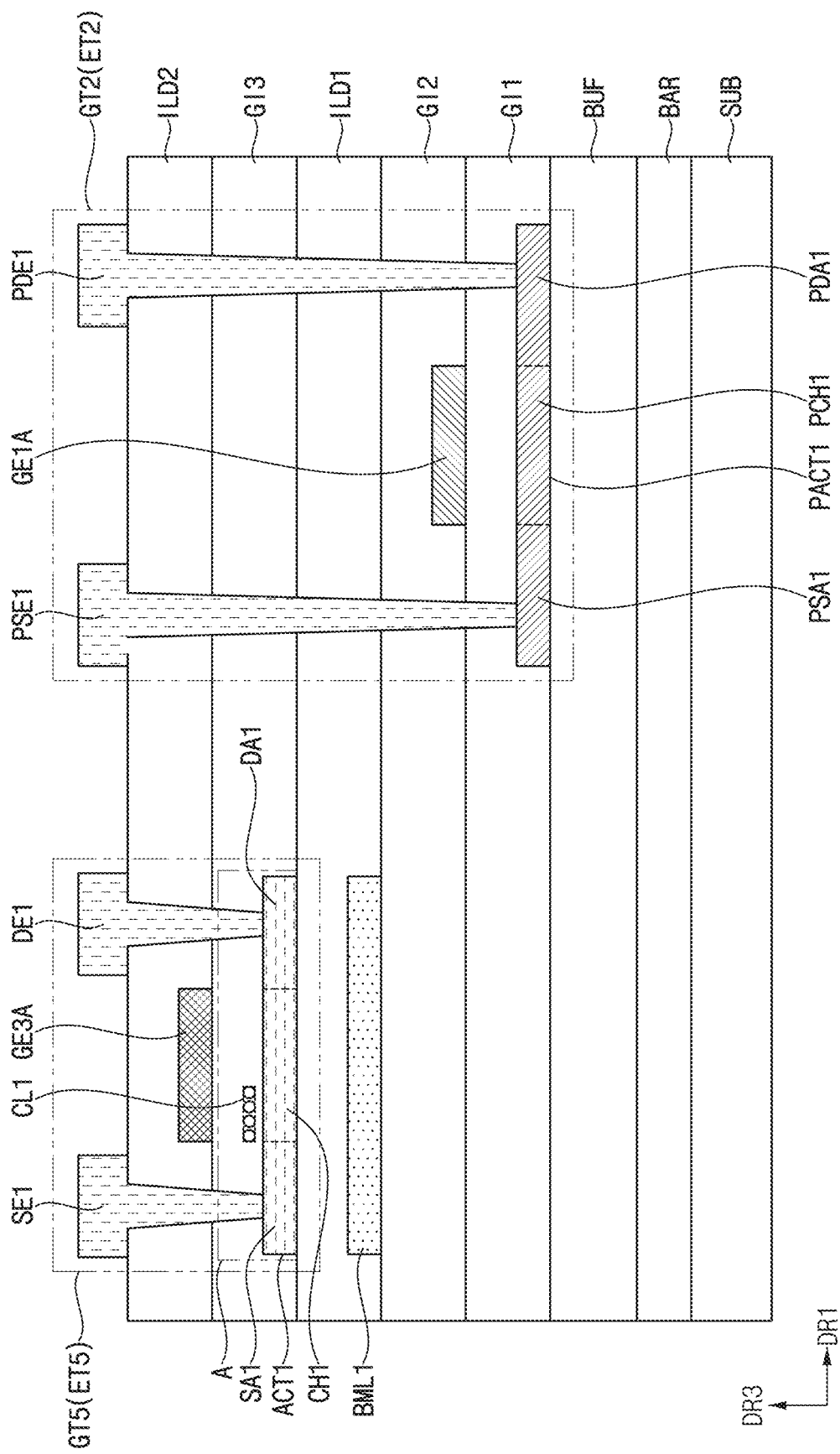
FIG. 6 is a cross-sectional view for describing a gate driver and/or an emission driver included in the display device of FIG. 2 in accordance with one or more embodiments of the present disclosure.
Figure 7:
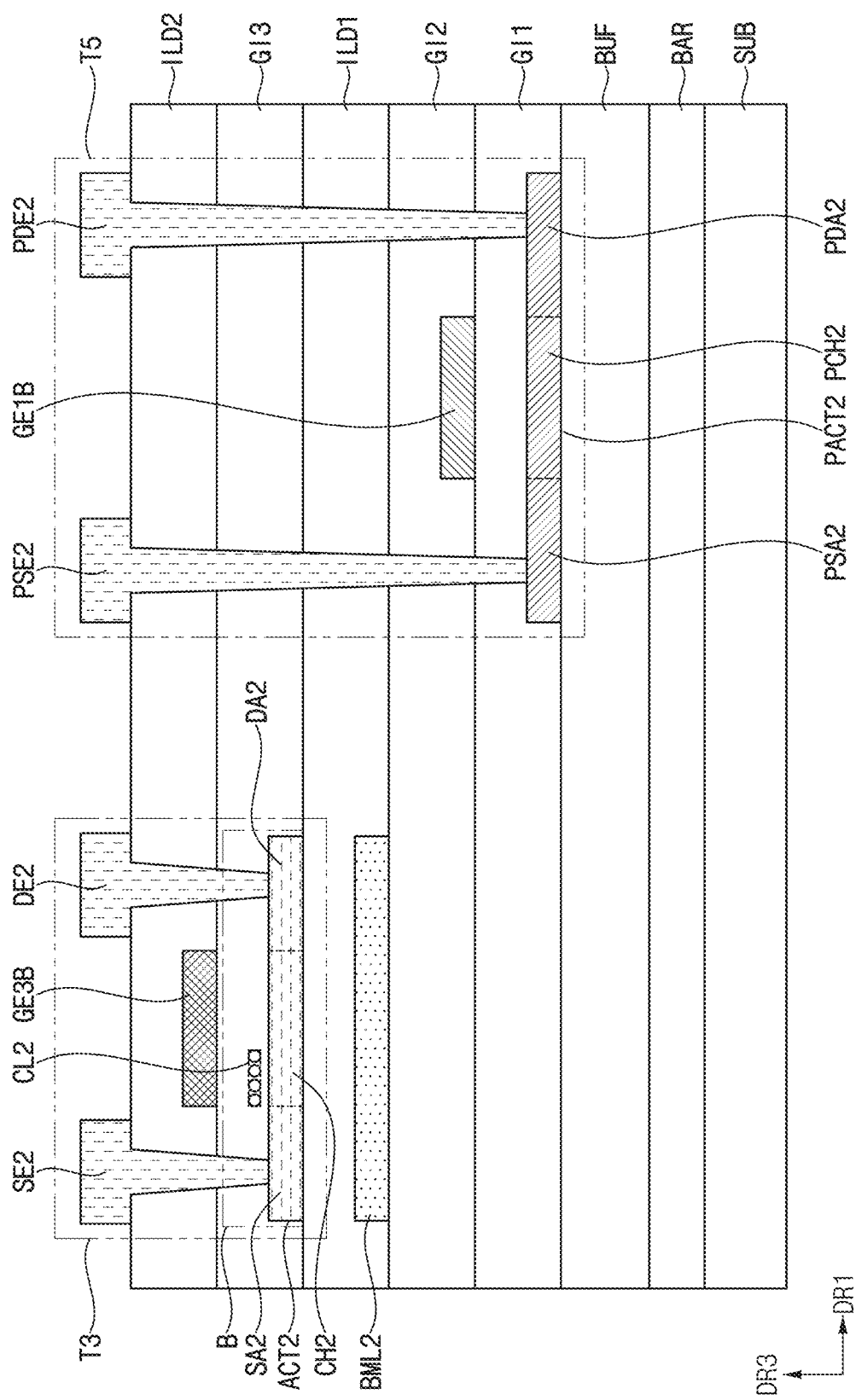
FIG. 7 is a cross-sectional view illustrating a pixel included in the display device of FIG. 1 in accordance with one or more embodiments of the present disclosure.

FIG. 6 is a cross-sectional view for describing a gate driver and/or an emission driver included in the display device of FIG. 2 in accordance with one or more embodiments of the present disclosure. FIG. 7 is a cross-sectional view illustrating a pixel included in the display device of FIG. 1 in accordance with one or more embodiments of the present disclosure.

Specifically, FIG. 6 is a cross-sectional view illustrating the second gate transistor GT2 of FIG. 4 (or the second emission transistor ET2 of FIG. 5) and the fifth gate transistor GT5 of FIG. 4 (or the fifth emission transistor ET5 of FIG. 5). In some aspects, FIG. 7 is a cross-sectional view illustrating the third transistor T3 and the fifth transistor T5 of FIG. 3.

Referring to FIGS. 4, 5, and 6, a display device (e.g., the display device DD of FIG. 2) may include a substrate SUB, a barrier layer BAR, a buffer layer BUF, a first gate insulating layer GI1, a second gate insulating layer GI2, a first interlayer insulating layer ILD1, a third gate insulating layer GI3, a second interlayer insulating layer ILD2, a first silicon semiconductor layer PACT1, a first lower gate electrode GE1A, a 1-1 source electrode PSE1, a 1-1 drain electrode PDE1, a first lower metal layer BML1, a first oxide semiconductor layer ACT1, a first upper gate electrode GE3A, a 1-2 source electrode SE1, a 1-2 drain electrode DE1, and a first charge layer CL1.

The substrate SUB may include a transparent material or an opaque material. The substrate SUB may be formed of a transparent resin substrate. Examples of the transparent resin substrate may include a polyimide substrate. In the example of a polyimide substrate, the polyimide substrate may include a first organic layer, a first barrier layer, a second organic layer, and the like.

Alternatively, or additionally, the substrate SUB may include a quartz substrate (e.g. a synthetic quartz substrate, a fluorine-doped quartz substrate), a calcium fluoride substrate, a sodalime substrate, a non-alkali glass substrate, or the like. The example materials may be used alone or in combination with each other.

The barrier layer BAR may be disposed on the substrate SUB. The barrier layer BAR may prevent impurities from penetrating into an upper portion of the substrate SUB from the outside. For example, the barrier layer BAR may include an inorganic material such as, for example, silicon oxide, silicon nitride, silicon oxynitride, or the like. The example materials may be used alone or in combination with each other. In some aspects, the barrier layer BAR may be formed in a single layer structure or a multilayer structure.

The buffer layer BUF may be disposed on the barrier layer BAR. The buffer layer BUF may prevent diffusion of metal atoms or impurities from the substrate SUB into the first silicon semiconductor layer PACT1.

For example, the buffer layer BUF may include an inorganic material such as, for example, silicon oxide, silicon nitride, silicon oxynitride, or the like. The example materials may be used alone or in combination with each other.

The first silicon semiconductor layer PACT1 may be disposed on the buffer layer BUF. In an embodiment, the first silicon semiconductor layer PACT1 may include a silicon semiconductor. For example, the silicon semiconductor may include amorphous silicon, polycrystalline silicon, and the like. For example, the first silicon semiconductor layer PACT1 may include polycrystalline silicon formed by crystallizing the amorphous silicon.

The first silicon semiconductor layer PACT1 may include a first source area PSA1, a first drain area PDA1, and a first channel area PCH1. The first channel area PCH1 may be disposed between the first source area PSA1 and the first drain area PDA1. That is, the first drain area PDA1 may be spaced apart from the first source area PSA1 in the first direction DR1, with the first channel area PCH1 interposed between the first drain area PDA1 and the first source area PSA1.

The first gate insulating layer GI1 may be disposed on the buffer layer BUF. The first gate insulating layer GI1 may cover the first silicon semiconductor layer PACT1.

For example, the first gate insulating layer GI1 may include an inorganic material such as, for example, silicon oxide, silicon nitride, silicon carbide, silicon oxynitride, silicon oxycarbide, or the like. The example materials may be used alone or in combination with each other.

The first lower gate electrode GE1A may be disposed on the first gate insulating layer GI1. The first lower gate electrode GE1A may overlap the first channel area PCH1 of the first silicon semiconductor layer PACT1 in a plan view.

For example, the first lower gate electrode GE1A may include a metal, an alloy, a metal nitride, a conductive metal oxide, a transparent conductive material, or the like. The example materials may be used alone or in combination with each other.

Examples of the metal may include silver ("Ag"), molybdenum ("Mo"), aluminum ("Al"), tungsten ("W"), copper ("Cu"), nickel ("Ni"), chromium ("Cr"), titanium ("Ti"), tantalum ("Ta"), platinum ("Pt"), scandium ("Sc"), or the like. The example materials may be used alone or in combination with each other.

Examples of the conductive metal oxide may include indium tin oxide, indium zinc oxide, or the like. The example materials may be used alone or in combination with each other.

In some aspects, examples of the metal nitride may include aluminum nitride ("$AlN_x$"), tungsten nitride ("$WN_x$"), chromium nitride ("$CrN_x$"), or the like. The example materials may be used alone or in combination with each other.

The second gate insulating layer GI2 may be disposed on the first gate insulating layer GI1. The second gate insulating layer GI2 may cover the first lower gate electrode GE1A. The second gate insulating layer GI2 may include substantially the same material as the first gate insulating layer GI1.

The first lower metal layer BML1 may be disposed on the second gate insulating layer GI2. The first lower metal layer BML1 may include substantially the same material as the first lower gate electrode GE1A.

The first interlayer insulating layer ILD1 may be disposed on the second gate insulating layer GI2. The first interlayer insulating layer ILD1 may cover the first lower metal layer BML1.

For example, the first interlayer insulating layer ILD1 may include an inorganic material such as, for example, silicon oxide, silicon nitride, silicon carbide, silicon oxynitride, silicon oxycarbide, or the like. The example materials may be used alone or in combination with each other.

The first oxide semiconductor layer ACT1 may be disposed on the first interlayer insulating layer ILD1. The first oxide semiconductor layer ACT1 may overlap the first lower metal layer BML1 in a plan view. The first oxide semiconductor layer ACT1 may include a first source area SA1, a first drain area DA1, and a first channel area CH1. The first channel area CH1 may be disposed between the first source area SA1 and the first drain area DA1. That is, the first drain area DA1 may be spaced apart from the first source area SA1 in the first direction DR1, with the first channel area CH1 interposed between the first drain area DA1 and the first source area SA1. The first oxide semiconductor layer ACT1 may include an oxide semiconductor.

In an embodiment, the oxide semiconductor may include an n-type semiconductor. For example, the oxide semiconductor may include zinc oxide ("ZnO"), indium oxide ("$In_2O_3$"), indium zinc oxide ("IZO"), zinc tin oxide ("ZTO"), indium gallium zinc oxide ("IGZO"), indium tin zin oxide ("ITZO"), gallium zinc oxide ("GZO"), indium tin oxide ("ITO"), hafnium indium zinc oxide ("HIZO"), tin oxide ("$SnO_2$"), or the like. The example materials may be used alone or in combination with each other.

In another embodiment, the oxide semiconductor may include a p-type semiconductor. For example, the oxide semiconductor may include tin oxide ("SnO"), copper oxide ("$Cu_2O$"), or the like. The example materials may be used alone or in combination with each other.

In an embodiment, the oxide semiconductor may further include indium ("In"), gallium ("Ga"), tin ("Sn"), zirconium ("Zr"), vanadium ("V"), hafnium ("Hf"), cadmium ("Cd"), germanium ("Ge"), chromium ("Cr"), titanium ("Ti"), and zinc ("Zn"). The example materials may be used alone or in combination.

The third gate insulating layer GI3 may be disposed on the first interlayer insulating layer ILD1. The third gate insulating layer GI3 may cover the first oxide semiconductor layer ACT1. The third gate insulating layer GI3 may include substantially the same material as the first gate insulating layer GI1. For example, a portion of the third gate insulating layer GI3 covering the first oxide semiconductor layer ACT1 may be referred to as a first insulating layer.

The first upper gate electrode GE3A may be disposed on the third gate insulating layer GI3. The first upper gate electrode GE3A may overlap the first channel area CH1 of the first oxide semiconductor layer ACT1 in a plan view. The first upper gate electrode GE3A may include a metal, an alloy, a conductive metal oxide, a transparent conductive material, or the like. The example materials may be used alone or in combination with each other. For example, the first upper gate electrode GE3A may be referred to as a first gate electrode.

The first charge layer CL1 may be disposed between the first upper gate electrode GE3A and the first oxide semiconductor layer ACT1. That is, the first charge layer CL1 may be disposed in the third gate insulating layer GI3. The first charge layer CL1 may overlap at least a portion of the first channel area CH1 of the first oxide semiconductor layer ACT1 in a plan view.

The second interlayer insulating layer ILD2 may be disposed on the third gate insulating layer GI3. The second interlayer insulating layer ILD2 may cover the first upper gate electrode GE3A. The second interlayer insulating layer ILD2 may include substantially the same material as the first interlayer insulating layer ILD1.

The 1-1 source electrode PSE1, the 1-1 drain electrode PDE1, the 1-2 source electrode SE1, and the 1-2 drain electrode DE1 may be disposed on the second interlayer insulating layer ILD2.

The 1-2 source electrode SE1 may be connected to the first source area SA1 of the first oxide semiconductor layer ACT1. In some aspects, a signal may be input to the 1-2 source electrode SE1. For example, the start signal FLM may be input to the 1-2 source electrode SE1.

The 1-2 drain electrode DE1 may be connected to the first drain area DA1 of the first oxide semiconductor layer ACT1. In some aspects, the signal may be output to the 1-2 drain electrode DE1. For example, the start signal FLM may be output to the 1-2 drain electrode DE1. Accordingly, for example, the fifth gate transistor GT5 (and similarly, the fifth emission transistor ET5) may receive a signal (e.g., start signal FLM) at the 1-2 source electrode SE1 and output the signal via the 1-2 drain electrode DE1.

The 1-1 drain electrode PDE1 may be connected to the first drain area PDA1 of the first silicon semiconductor layer PACT1. In some aspects, the 1-1 source electrode PSE1 may be connected to the first source area PSA1 of the first silicon semiconductor layer PACT1. The 1-1 source electrode PSE1, the 1-1 drain electrode PDE1, the 1-2 source electrode SE1, and the 1-2 drain electrode DE1 may be disposed in the same layer and may include the same material. For example, The 1-1 source electrode PSE1, the 1-1 drain electrode PDE1, the 1-2 source electrode SE1, and the 1-2 drain electrode DE1 may include a metal, an alloy, a conductive metal oxide, a transparent conductive material, or the like. The example materials may be used alone or in combination with each other.

In an embodiment, the second gate transistor GT2 may include the first silicon semiconductor layer PACT1, the first lower gate electrode GE1A, the 1-1 source electrode PSE1, and the 1-1 drain electrode PDE1. That is, the second gate transistor GT2 may be a PMOS transistor including a silicon semiconductor layer. In some aspects, each of the first gate transistor GT1, the third gate transistor GT3, and the fourth gate transistor GT4 may have substantially the same structure as the second gate transistor GT2. That is, each of the first gate transistor GT1, the third gate transistor GT3, and the fourth gate transistor GT4 may be a PMOS transistor.

However, embodiments of the present disclosure are not limited thereto, and in another embodiment, each of the first gate transistor GT1, the second gate transistor GT2, the third gate transistor GT3, and the fourth gate transistor GT4 may be an NMOS transistor.

In another embodiment, some of the first gate transistor GT1, the second gate transistor GT2, the third gate transistor GT3, and the fourth gate transistor GT4 may be PMOS transistors, and the other (or others) may be NMOS transistors.

The second emission transistor ET2 may have substantially the same structure as the second gate transistor GT2. That is, the second emission transistor ET2 may be a PMOS transistor. In some aspects, each of the first emission transistor ET1, the third emission transistor ET3, and the fourth emission transistor ET4 may have substantially the same structure as the second emission transistor ET2. That is, each of the first emission transistor ET1, the third emission transistor ET3, and the fourth emission transistor ET4 may be a PMOS transistor.

However, embodiments of the present disclosure are not limited thereto, and in another embodiment, each of the first emission transistor ET1, the second emission transistor ET2, the third emission transistor ET3, and the fourth emission transistor ET4 may be an NMOS transistor.

In another embodiment, some of the first emission transistor ET1, the second emission transistor ET2, the third emission transistor ET3, and the fourth emission transistor ET4 may be PMOS transistors, and the other (or others) may be NMOS transistors.

In an embodiment, the fifth gate transistor GT5 may include the first oxide semiconductor layer ACT1, the first upper gate electrode GE3A, the 1-2 source electrode SE1, and the 1-2 drain electrode DE1. That is, the fifth gate transistor GT5 may be an NMOS transistor including an oxide semiconductor layer. In some aspects, each of the sixth gate transistor GT6 and the seventh gate transistor GT7 may have substantially the same structure as the fifth gate transistor GT5. That is, each of the sixth gate transistor GT6 and the seventh gate transistor GT7 may be an NMOS transistor.

The fifth emission transistor ET5 may have substantially the same structure as the fifth gate transistor GT5. That is, the fifth emission transistor ET5 may be an NMOS transistor. In some aspects, each of the sixth emission transistor ET6 and the seventh emission transistor ET7 may have substantially the same structure as the fifth emission transistor ET5. That is, each of the sixth emission transistor ET6 and the seventh emission transistor ET7 may be an NMOS transistor.

Referring to FIGS. 3 and 7, the pixel PX may include the substrate SUB, the barrier layer BAR, the buffer layer BUF, the first gate insulating layer GI1, the second gate insulating layer GI2, the first interlayer insulating layer ILD1, the third gate insulating layer GI3, the second interlayer insulating layer ILD2, a second silicon semiconductor layer PACT2, a second lower gate electrode GE1B, a 2-1 source electrode PSE2, a 2-1 drain electrode PDE2, a second lower metal layer BML2, a second oxide semiconductor layer ACT2, a second upper gate electrode GE3B, a 2-2 source electrode SE2, a 2-2 drain electrode DE2, and a second charge layer CL2.

The pixel PX of FIGS. 3 and 7 includes aspects of the gate driver and/or the emission driver of FIG. 6 described herein, and repeated descriptions of like elements are omitted for brevity. In describing a cross-sectional structure of the pixel PX of FIGS. 3 and 7, the same reference numerals are assigned to substantially the same configuration as those included in the gate driver and/or the emission driver of FIG. 6, and repeated detailed descriptions thereof may be omitted.

The second silicon semiconductor layer PACT2 may be disposed on the buffer layer BUF. In an embodiment, the second silicon semiconductor layer PACT2 may include substantially the same material as the first silicon semiconductor layer PACT1 of FIG. 6.

The second silicon semiconductor layer PACT2 may include a second source area PSA2, a second drain area PDA2, and a second channel area PCH2. The second channel area PCH2 may be disposed between the second source area PSA2 and the second drain area PDA2. That is, the second drain area PDA2 may be spaced apart from the second source area PSA2 in the first direction DR1 with the second channel area PCH2 interposed between the second drain area PDA2 and the second source area PSA2.

The second lower gate electrode GELB may be disposed on the first gate insulating layer GI1. The second lower gate electrode GELB may overlap the second channel area PCH2 of the second silicon semiconductor layer PACT2 in a plan view. For example, the second lower gate electrode GE1B may include substantially the same material as the first lower gate electrode GE1A of FIG. 6.

The second lower metal layer BML2 may be disposed on the second gate insulating layer GI2. The second lower metal layer BML2 may include substantially the same material as the first lower metal layer BML1 of FIG. 6.

The second oxide semiconductor layer ACT2 may be disposed on the first interlayer insulating layer ILD1. The second oxide semiconductor layer ACT2 may overlap the second lower metal layer BML2 in a plan view. The second oxide semiconductor layer ACT2 may include a second source area SA2, a second drain area DA2, and a second channel area CH2. The second channel area CH2 may be disposed between the second source area SA2 and the second drain area DA2. That is, the second drain area DA2 may be spaced apart from the second source area SA2 in the first direction DR1 with the second channel area CH2 interposed between the second drain area DA2 and the second source area SA. The second oxide semiconductor layer ACT2 may include substantially the same material as the first oxide semiconductor layer ACT1 of FIG. 6.

The second upper gate electrode GE3B may be disposed on the third gate insulating layer GI3. The second upper gate electrode GE3B may overlap the second channel area CH2 of the second oxide semiconductor layer ACT2 in a plan view. The second upper gate electrode GE3B may include substantially the same material as the first upper gate electrode GE3A of FIG. 6. For example, the second upper gate electrode GE3B may be referred to as a second gate electrode. In some aspects, a portion of the third gate insulating layer GI3 covering the second oxide semiconductor layer ACT2 may be referred to as a second insulating layer.

The second charge layer CL2 may be disposed between the second upper gate electrode GE3B and the second oxide semiconductor layer ACT2. That is, the second charge layer CL2 may be disposed in the third gate insulating layer GI3. The second charge layer CL2 may overlap a portion of the second channel area CH2 of the second oxide semiconductor layer ACT2 in a plan view.

The 2-1 source electrode PSE2, the 2-1 drain electrode PDE2, the 2-2 source electrode SE2, and the 2-2 drain electrode DE2 may be disposed on the second interlayer insulating layer ILD2.

The 2-2 source electrode SE2 may be connected to the second source area SA2 of the second oxide semiconductor layer ACT2. In some aspects, a signal or a voltage may be input to the 2-2 source electrode SE2. For example, the first power supply voltage EVLDD may be input to the 2-2 source electrode SE2.

The 2-2 drain electrode DE2 may be connected to the second drain area DA2 of the second oxide semiconductor layer ACT2. In some aspects, the signal or the voltage may be output to the 2-2 drain electrode DE2. For example, the first power supply voltage ELVDD may be output to the 2-2 drain electrode DE2.

The 2-1 drain electrode PDE2 may be connected to the second drain area PDA2 of the second silicon semiconductor layer PACT2. In some aspects, the 2-1 source electrode PSE2 may be connected to the second source area PSA2 of the second silicon semiconductor layer PACT2.

The 2-1 source electrode PSE2, the 2-1 drain electrode PDE2, the 2-2 source electrode SE2, and the 2-2 drain electrode DE2 may be disposed in the same layer and may include the same material. For example, The 2-1 source electrode PSE2, the 2-1 drain electrode PDE2, the 2-2 source electrode SE2, and the 2-2 drain electrode DE2 may include a metal, an alloy, a metal nitride, a conductive metal oxide, a transparent conductive material, or the like. The example materials may be used alone or in combination with each other.

In an embodiment, the fifth transistor T5 may include the second silicon semiconductor layer PACT2, the second lower gate electrode GE1B, the 2-1 source electrode PSE2, and the 2-1 drain electrode PDE2. That is, the fifth transistor T5 may be a PMOS transistor including a silicon semiconductor layer. In some aspects, each of the first transistor T1, the second transistor T2, the sixth transistor T6, the seventh transistor T7, and the eighth transistor T8 may have substantially the same structure as the fifth transistor T5. That is, each of the first transistor T1, the second transistor T2, the sixth transistor T6, the seventh transistor T7, and the eighth transistor T8 may be a PMOS transistor.

However, embodiments of the present disclosure are not limited thereto, and in another embodiment, each of the first transistor T1, the second transistor T2, the fifth transistor T5, the sixth transistor T6, the seventh transistor T7, and the eighth transistor T8 may be an NMOS transistor.

In another embodiment, some of the first transistor T1, the second transistor T2, the fifth transistor T5, the sixth transistor T6, the seventh transistor T7, and the eighth transistor T8 may be PMOS transistors, and the other (or others) may be NMOS transistors.

In an embodiment, the third transistor T3 may include the second oxide semiconductor layer ACT2, the second upper gate electrode GE3B, the 2-2 source electrode SE2, and the 2-2 drain electrode DE2. That is, the third transistor T3 may be an NMOS transistor including an oxide semiconductor layer. In some aspects, the fourth transistor T4 may have substantially the same structure as the third transistor T3. That is, the fourth transistor T4 may be an NMOS transistor.

Figure 8:
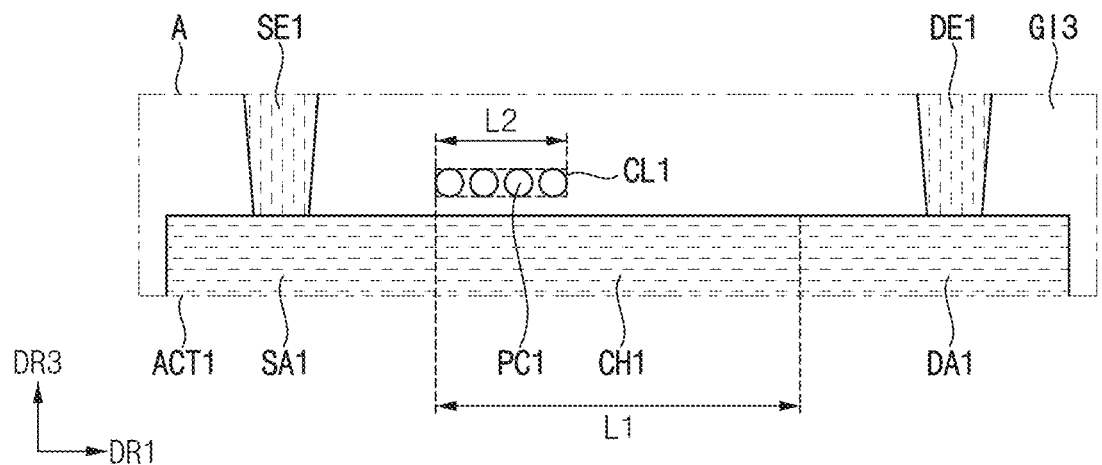
FIG. 8 is an enlarged cross-sectional view illustrating an example of area A of FIG. 6 in accordance with one or more embodiments of the present disclosure.
Figure 9:
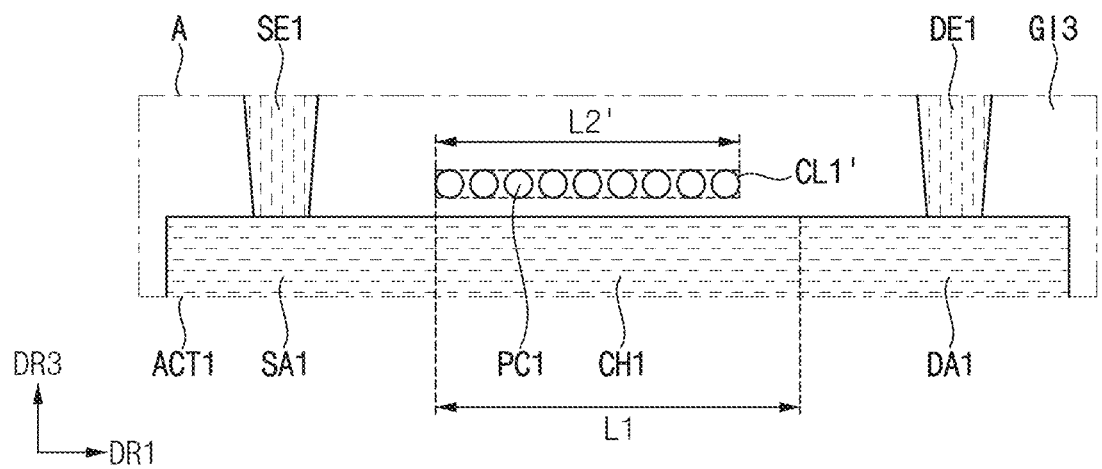
FIG. 9 is an enlarged cross-sectional view illustrating another example of area A of FIG. 6 in accordance with one or more embodiments of the present disclosure.

FIG. 8 is an enlarged cross-sectional view illustrating an example of area A of FIG. 6. FIG. 9 is an enlarged cross-sectional view illustrating another example of area A of FIG. 6.

Referring to FIGS. 6 and 8, the first charge layer CL1 may overlap at least a portion of the first channel area CH1 of the first oxide semiconductor layer ACT1. In an embodiment, the first charge layer CL1 may be disposed adjacent to the first source area SA1. In some aspects, the first charge layer CL1 may be disposed such that the first charge layer CL1 is spaced apart from the first drain area DA1.

In an embodiment, the first charge layer CL1 may be disposed such that the first charge layer CL1 is spaced apart from the first oxide semiconductor layer ACT1. For example, the first charge layer CL1 may be disposed such that the first charge layer CL1 is spaced apart from the first oxide semiconductor layer ACT1 with a portion of the third gate insulating layer GI3 interposed between the first charge layer CL1 and the first oxide semiconductor layer ACT1. That is, the first charge layer CL1 may not be in contact with the first oxide semiconductor layer ACT1.

In an embodiment, a width L2 of the first charge layer CL1 in the first direction DR1 may be less than half of a width L1 of the first channel area CH1 of the first oxide semiconductor layer ACT1 in the first direction DR1. In another embodiment, the width L2 of the first charge layer CL1 may be substantially the same as half of the width L1 of the first channel area CH1 of the first oxide semiconductor layer ACT1.

Referring to FIG. 9, in another embodiment, a width L2' of a first charge layer CL1 may be greater than half of the width L1 of the first channel area CH1 of the first oxide semiconductor layer ACT1.

Referring back to FIGS. 6 and 8, the first charge layer CL1 may include particles PC1. As mentioned herein, in an embodiment, the first oxide semiconductor layer ACT1 may be an n-type semiconductor. In this case, each of the first source area SA1 and the first drain area DA1 may be doped with n-type impurity ions.

In this case, the particles PC1 may include negatively charged particles. For example, the particles PC1 may include electrons. However, embodiments of the present disclosure are not limited thereto, and the particles PC1 may include particles different from electrons.

As the first charge layer CL1 is disposed between the first oxide semiconductor layer ACT1 and the first upper gate electrode GE3A, threshold voltages of the fifth gate transistor GT5 and/or the fifth emission transistor ET5 may be shifted in a positive direction. Accordingly, embodiments of the present disclosure support preventing a phenomenon in which the fifth gate transistor GT5 and/or the fifth emission transistor ET5 are turned on when a signal value lower than a specific value is provided to the first upper gate electrode GE3A of the fifth gate transistor GT5 and/or the fifth emission transistor ET5. Therefore, reliability of the gate driver (e.g., the gate driver 200 of FIG. 2) and the emission driver (e.g., the emission driver 500 of FIG. 2) may be improved.

As mentioned herein, in another embodiment, the first oxide semiconductor layer ACT1 may be a p-type semiconductor. In this case, each of the first source area SA1 and the first drain area DA1 may be doped with p-type impurity ions. In this case, the particles PC1 may include positively charged particles.

In this case, as the first charge layer CL1 is disposed between the first oxide semiconductor layer ACT1 and the first upper gate electrode GE3A, threshold voltages of the fifth gate transistor GT5 and/or the fifth emission transistor ET5 may be shifted in a negative direction.

Figure 10:
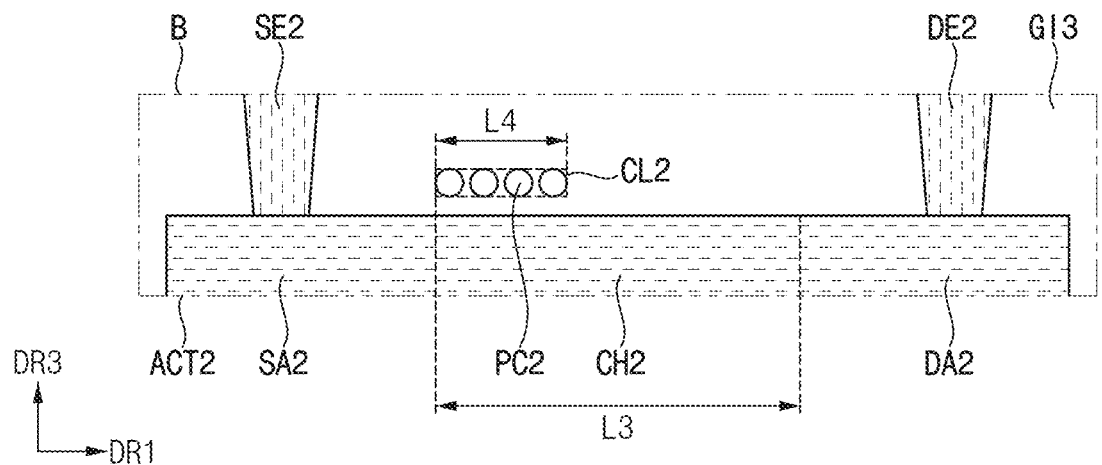
FIG. 10 is an enlarged cross-sectional view illustrating an example of area B of FIG. 7 in accordance with one or more embodiments of the present disclosure.
Figure 11:
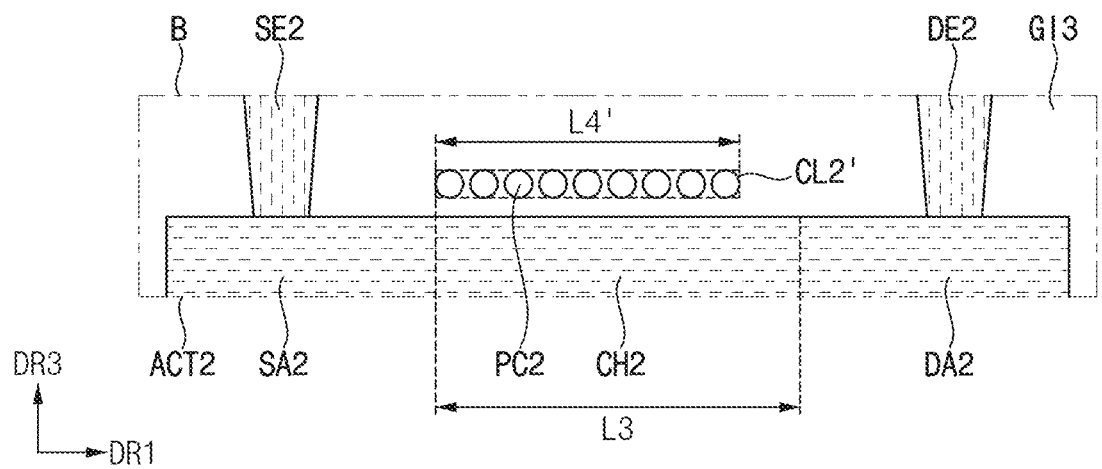
FIG. 11 is an enlarged cross-sectional view illustrating another example of area B of FIG. 7 in accordance with one or more embodiments of the present disclosure.

FIG. 10 is an enlarged cross-sectional view illustrating an example of area B of FIG. 7. FIG. 11 is an enlarged cross-sectional view illustrating another example of area B of FIG. 7.

Referring to FIGS. 7 and 10, the second charge layer CL2 may overlap at least a portion of a second channel area CH2 of the second oxide semiconductor layer ACT2. In an embodiment, the second charge layer CL2 may be disposed adjacent to the second source area SA2. In some aspects, the second charge layer CL2 may be disposed such that the second charge layer CL2 is spaced apart from the second drain area DA2.

In an embodiment, the second charge layer CL2 may be disposed such that the second charge layer CL2 is spaced apart from the second oxide semiconductor layer ACT2. For example, the second charge layer CL2 may be disposed such that the second charge layer CL2 is spaced apart from the second oxide semiconductor layer ACT2 with a portion of the third gate insulating layer GI3 interposed between the second charge layer CL2 and the second oxide semiconductor layer ACT2. That is, the second charge layer CL2 may not be in contact with the second oxide semiconductor layer ACT2.

In an embodiment, a width L4 of the second charge layer CL2 in the first direction DR1 may be less than half of a width L3 of the second channel area CH2 of the second oxide semiconductor layer ACT2 in the first direction DR1. In another embodiment, (not illustrated), the width L4 of the second charge layer CL2 may be substantially the same as half of the width L3 of the second channel area CH2 of the second oxide semiconductor layer ACT2.

Referring to FIG. 11, in another embodiment, a width L4' of the second charge layer CL2' may be greater than half of the width L3 of the second channel area CH2 of the second oxide semiconductor layer ACT2.

Referring back to FIGS. 7 and 10, the second charge layer CL2 may include particles PC2. In an embodiment, the second oxide semiconductor layer ACT2 may be an n-type semiconductor. In this case, each of the second source area SA2 and the second drain area DA2 may be doped with n-type impurity ions.

In this case, the particles PC2 may include negatively charged particles. For example, the particles PC2 may include electrons. However, embodiments of the present disclosure are not limited thereto, and the particles PC2 may include electrons and other particles.

As the second charge layer CL2 is disposed between the second oxide semiconductor layer ACT2 and the second upper gate electrode GE3B, threshold voltages of the third transistor T3 may be shifted in a positive direction. Accordingly, embodiments of the present disclosure support preventing a phenomenon in which the third transistor T3 are turned on when a signal value lower than a specific value is provided to the second upper gate electrode GE3B of the third transistor T3. Therefore, reliability of the pixel circuit (e.g., the pixel circuit PXC of FIG. 3) may be improved.

FIGS. 12, 13, 14, 15, and 16 are cross-sectional views illustrating a method of manufacturing a gate driver and/or an emission driver included in the display device of FIG. 2 in accordance with one or more embodiments of the present disclosure.

In the descriptions of the method and processes herein, the operations may be performed in a different order than the order shown and/or described, or the operations may be performed in different orders or at different times. Certain operations may also be left out of the method and processes, one or more operations may be repeated, or other operations may be added. Descriptions that an element "may be disposed," "may be formed," and the like include methods, processes, and techniques for disposing, forming, positioning, and modifying the element, and the like in accordance with example aspects described herein.

Figure 12:
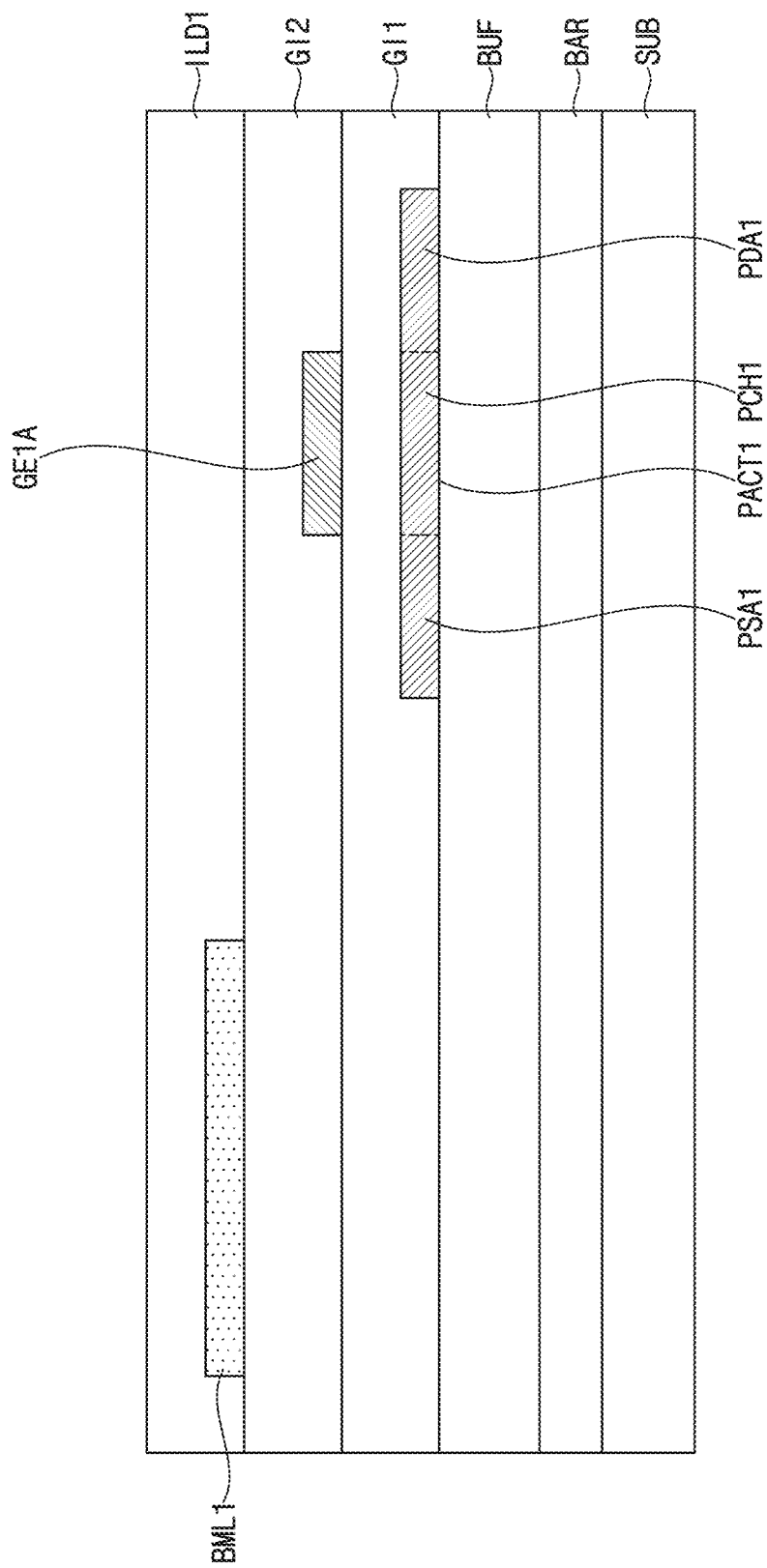
FIGS. 12, 13, 14, 15, and 16 are cross-sectional views illustrating a method of manufacturing a gate driver and/or an emission driver included in the display device of FIG. 2 in accordance with one or more embodiments of the present disclosure.

Referring to FIG. 12, the method may include forming the barrier layer BAR on the substrate SUB. In some aspects, the method may include forming the buffer layer BUF on the barrier layer BAR. In some aspects, the method may include forming the first silicon semiconductor layer PACT1 on the buffer layer BUF. The first silicon semiconductor layer PACT1 may include the first source area PSA1, the first drain area PDA1, and the first channel area PCH1. The first channel area PCH1 may be disposed between the first source area PSA1 and the first drain area PDA1.

The method may include forming the first gate insulating layer GI1 on the buffer layer BUF. The first gate insulating layer GI1 may be formed such that first gate insulating layer GI1 covers the first silicon semiconductor layer PACT1.

The method may include forming the first lower gate electrode GELA on the first gate insulating layer GI1. The first lower gate electrode GELA may be formed such that the first lower gate electrode GELA overlaps the first channel area PCH1 of the first silicon semiconductor layer PACT1 in a plan view.

The method may include forming the second gate insulating layer GI2 on the first gate insulating layer GI1. The second gate insulating layer GI2 may be formed such that the second gate insulating layer GI2 covers the first lower gate electrode GE1A.

The method may include forming the first lower metal layer BML1 on the second gate insulating layer GI2. The method may include forming the first interlayer insulating layer ILD1 on the second gate insulating layer GI2. The first interlayer insulating layer ILD1 may be formed such that the first interlayer insulating layer ILD1 covers the first lower metal layer BML1.

Figure 13:
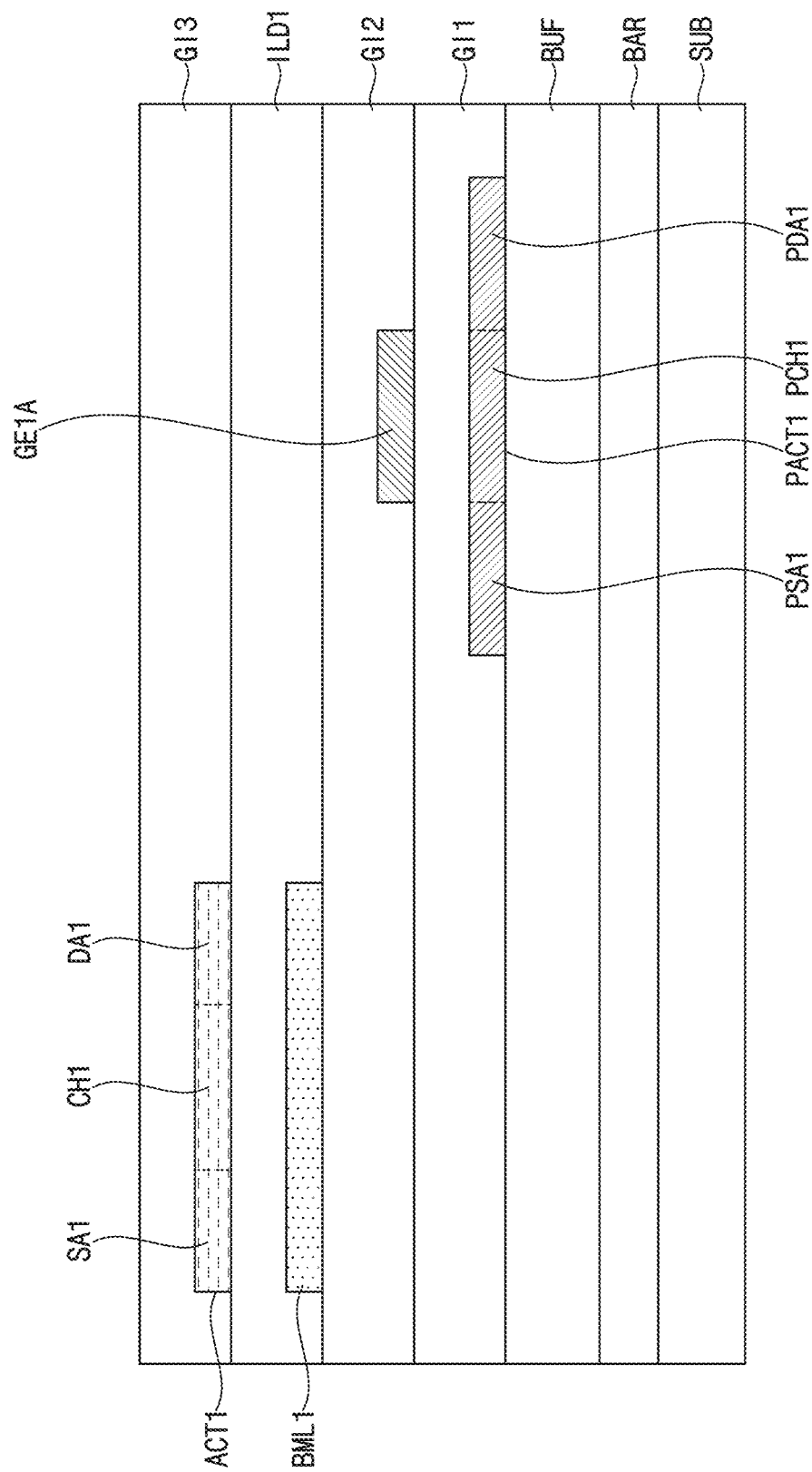

Referring to FIG. 13, the method may include forming the first oxide semiconductor layer ACT1 on the first interlayer insulating layer ILD1. The first oxide semiconductor layer ACT1 may be formed such that the first oxide semiconductor layer ACT1 overlaps the first lower metal layer BML1 in a plan view. The first oxide semiconductor layer ACT1 may include the first source area SA1, the first drain area DA1, and the first channel area CH1. The first channel area CH1 may be disposed between the first source area SA1 and the first drain area DA1. That is, the first drain area DA1 may be spaced apart from the first source area SA1 in the first direction DR1 with the first channel area CH1 interposed between the first drain area DA1 and the first source area SA1.

The method may include forming the third gate insulating layer GI3 on the first interlayer insulating layer ILD1. The third gate insulating layer GI3 may be formed such that the third gate insulating layer GI3 covers the first oxide semiconductor layer ACT1.

Figure 14:
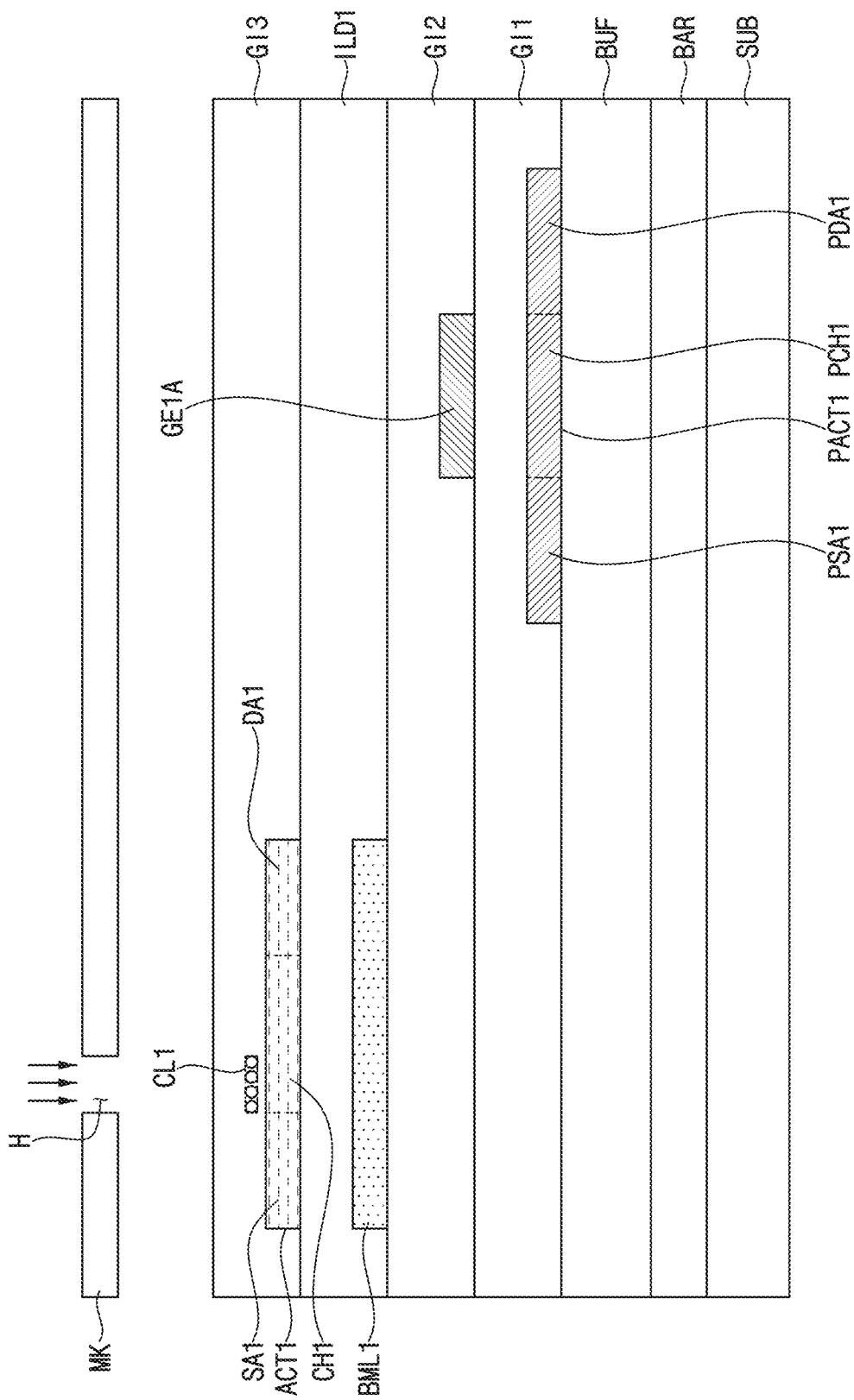

Referring to FIG. 14, the method may include implanting ions into the third gate insulating layer GI3 by using a mask MK. For example, the mask MK may define a hole H, and the method may include implanting the ions into a portion of the third gate insulating layer GI3 overlapping the hole H in a plan view. Accordingly, the first charge layer CL1 may be formed.

In an embodiment, the hole H may overlap at least a portion of the first channel area CH1 of the first oxide semiconductor layer ACT1 in a plan view. In some aspects, the hole H may be adjacent (e.g., in a plan view) to the first source area SA1 of the first oxide semiconductor layer ACT1. Accordingly, the method may include selectively implanting the ions into a portion of the third gate insulating layer GI3 overlapping at least a portion of the first channel area CH1 of the first oxide semiconductor layer ACT1. In some aspects, the method may include selectively implanting the ions into a portion of the third gate insulating layer GI3 adjacent to the first source area SA1 of the first oxide semiconductor layer ACT1. Accordingly, the method may include forming the first charge layer CL1 such that the first charge layer CL1 overlaps at least a portion of the first channel area CH1 of the first oxide semiconductor layer ACT1. In some aspects, the first charge layer CL1 may be formed such that the first charge layer CL1 is disposed adjacent to the first source area SA1 of the first oxide semiconductor layer ACT1.

In an embodiment, the method may include forming the first charge layer CL1 such that the first charge layer CL1 is spaced apart from the first oxide semiconductor layer ACT1. For example, the method may include forming the first charge layer CL1 such that the first charge layer CL1 is spaced apart from the first oxide semiconductor layer ACT1 with the third gate insulating layer GI3 interposed between the first charge layer CL1 and the first oxide semiconductor layer ACT1.

For example, the method may include adjusting a position where the first charge layer CL1 is formed by adjusting energy of ions injected into the third gate insulating layer GI3 through the hole H, by adjusting injection amounts of ions injected into the third gate insulating layer GI3 through the hole H, a combination of adjusting the energy and the injection amounts, and the like. Accordingly, the method may include adjusting the position where the first charge layer CL1 is formed such that the first charge layer CL1 is not formed up to the first oxide semiconductor layer ACT1.

For example, energy of ions injected into the third gate insulating layer GI3 through the hole H may be about 5 kV or more and 10 kV or less. For example, the energy of the ions may range from about 5 kV to about 10 kV. However, embodiments of the present disclosure are not limited to the example range, and the energy of the ions may be appropriately changed.

In some aspects, an injection amount of ions injected into the third gate insulating layer GI3 through the hole H may be about $3e11$ ions/cm$^2$ or more and about $3e12$ ions/cm$^2$ or less. For example, the injection amount may range from about $3e11$ ions/cm$^2$ to about $3e12$ ions/cm$^2$. However, embodiments of the present disclosure are not limited to the example range, and the injection amount of the ions may be appropriately changed.

Figure 15:
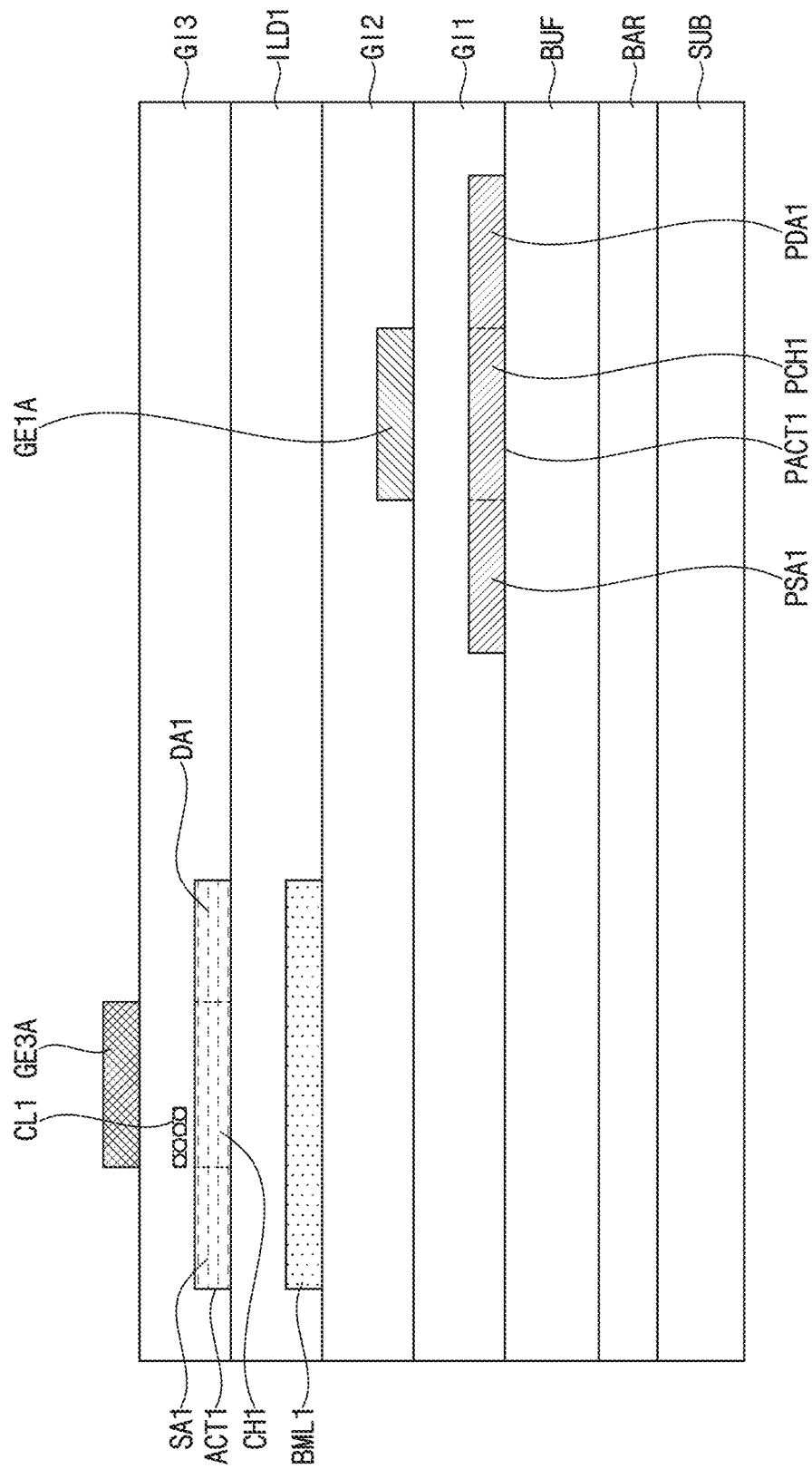

Referring to FIG. 15, the method may include forming the first upper gate electrode GE3A on the third gate insulating layer GI3. The method may include forming the first upper gate electrode GE3A such that the first upper gate electrode GE3A overlaps the first channel area CH1 of the first oxide semiconductor layer ACT1 in a plan view.

Figure 16:
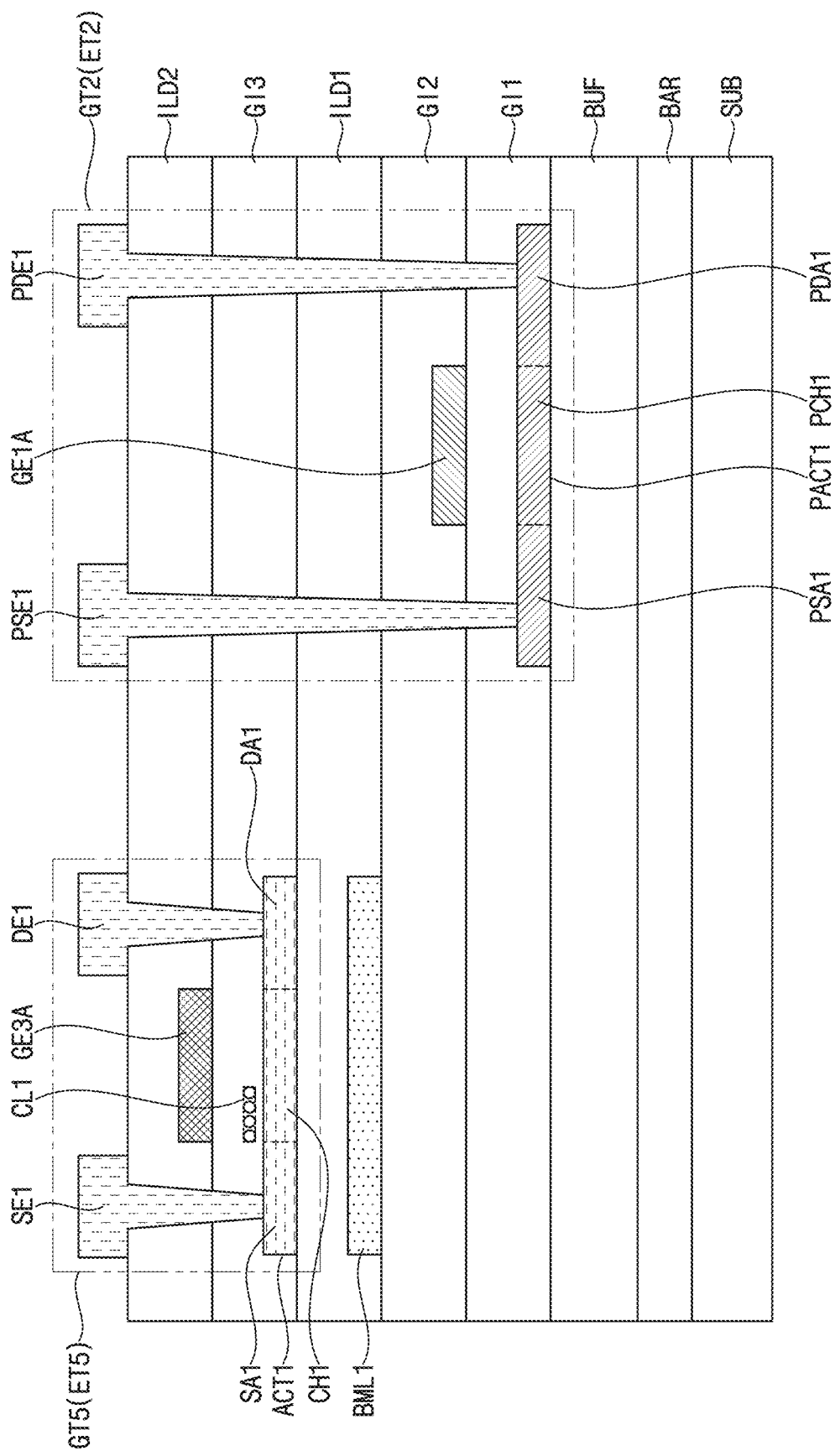

Referring to FIG. 16, the method may include forming the 1-1 source electrode PSE1, the 1-1 drain electrode PDE1, the 1-2 source electrode SE1, and the 1-2 drain electrode DE1 on the second interlayer insulating layer ILD2.

A method of manufacturing the gate driver and/or the emission driver in accordance with one or more embodiments of the present disclosure has been described with reference to FIGS. 12, 13, 14, 15, and 16, embodiments of the present disclosure are not limited thereto, and a method of manufacturing the pixel of FIG. 7 may be substantially the same as the described method of manufacturing the gate driver and/or the emission driver.

The present disclosure can be applied to various display devices. For example, the present disclosure is applicable to various display devices such as, for example, display devices for vehicles, ships and aircraft, portable communication devices, display devices for exhibition or information transmission, medical display devices, and the like.

Terms such as, for example, first, second, and the like may be used to describe various components, but the components should not be limited by the terms. The terms as used herein may distinguish one component from other components and are not to be limited by the terms. For example, without departing the scope of the present disclosure, a first component may be referred to as a second component, and similarly, the second component may also be referred to as the first component. The terms of a singular form may include plural forms unless otherwise specified.

The terminology used herein is for the purpose of describing particular embodiments only and is not intended to be limiting. As used herein, "a," "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

The terms "about" or "approximately" as used herein are inclusive of the stated value and include a suitable range of deviation for the particular value as determined by one of ordinary skill in the art, considering the measurement in question and the error associated with measurement of the particular quantity. The term "about" can mean within one or more standard deviations, or within +30%, 20%, 10%, 5% of the stated value, for example.

The term "substantially," as used herein, means approximately or actually equal (e.g., within a threshold percent of equal). The term "substantially simultaneously," as used herein, means approximately or actually at the same time (e.g., within a threshold percent of equal). The term "substantially the same," as used herein, means approximately or actually the same (e.g., within a threshold difference amount).

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases.

It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

The foregoing is illustrative of example embodiments and is not to be construed as limiting thereof. Although some embodiments have been described, those skilled in the art will readily appreciate that many modifications are possible in the embodiments without materially departing from the novel teachings and advantages of aspects and features supported by the present disclosure. Accordingly, all such modifications are intended to be included within the scope of aspects and features supported by the present disclosure as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A display device comprising:
   a pixel; and
   a driver electrically connected to the pixel,
   wherein the driver comprises:
   a first oxide semiconductor layer comprising a first source area, a first drain area, and a first channel area disposed between the first source area and the first drain area;
   a first gate electrode disposed on the first oxide semiconductor layer and overlapping the first channel area of the first oxide semiconductor layer in a plan view; and
   a first charge layer disposed between the first gate electrode and the first oxide semiconductor layer and overlapping at least a portion of the first channel area in a plan view.

2. The display device of claim 1, wherein the first charge layer is disposed adjacent to the first source area of the first oxide semiconductor layer.

3. The display device of claim 1, further comprising:
   a first insulating layer covering the first oxide semiconductor layer,
   wherein the first charge layer is disposed in the first insulating layer.

4. The display device of claim 3, wherein the first charge layer is disposed such that the first charge layer is spaced apart from the first oxide semiconductor layer with a portion of the first insulating layer interposed between the first charge layer and the first oxide semiconductor layer.

5. The display device of claim 1, wherein the first source area of the first oxide semiconductor layer and the first drain area of the first oxide semiconductor layer are spaced apart from each other in a first direction with the first channel area of the first oxide semiconductor layer interposed between the first source area and the first drain area, and a width of the first charge layer in the first direction is less than or equal to half of a width of the first channel area of the first oxide semiconductor layer in the first direction.

6. The display device of claim 1, wherein the first source area of the first oxide semiconductor layer and the first drain area of the first oxide semiconductor layer are spaced apart from each other in a first direction with the first channel area of the first oxide semiconductor layer interposed between the first source area and the first drain area, and a width of the first charge layer in the first direction is greater than a width of the first channel area of the first oxide semiconductor layer in the first direction.

7. The display device of claim 1, wherein the first oxide semiconductor layer comprises an n-type semiconductor.

8. The display device of claim 7, wherein the first charge layer comprises negatively charged particles.

9. The display device of claim 1, further comprising:
a first source electrode disposed on the first gate electrode, connected to the first source area of the first oxide semiconductor layer, and inputted with a signal; and
a first drain electrode disposed on the first gate electrode, connected to the first drain area of the first oxide semiconductor layer, and spaced apart from the first source electrode, wherein the signal is output to the first drain electrode.

10. The display device of claim 1, wherein the pixel comprises a pixel circuit, and
the pixel circuit comprises:
a second oxide semiconductor layer comprising a second source area, a second drain area, and a second channel area disposed between the second source area and the second drain area;
a second gate electrode disposed on the second oxide semiconductor layer and overlapping the second channel area of the second oxide semiconductor layer in a plan view; and
a second charge layer disposed between the second gate electrode and the second oxide semiconductor layer and overlapping at least a portion of the second channel area of the second oxide semiconductor layer in a plan view.

11. The display device of claim 10, wherein the second charge layer is disposed adjacent to the second source area of the second oxide semiconductor layer.

12. The display device of claim 10, further comprising:
a second insulating layer covering the second oxide semiconductor layer,
wherein the second charge layer is disposed in the second insulating layer.

13. The display device of claim 10, wherein the second source area of the second oxide semiconductor layer and the second drain area of the second oxide semiconductor layer are spaced apart from each other in a first direction with the second channel area of the second oxide semiconductor layer interposed between the second source area and the second drain area, and a width of the second charge layer in the first direction is less than or equal to half of a width of the second channel area of the second oxide semiconductor layer in the first direction.

14. The display device of claim 1, wherein the driver is a gate driver coupled to the pixel and configured to provide a gate signal to the pixel.

15. The display device of claim 1, wherein the driver is an emission driver coupled to the pixel and configured to provide an emission signal to the pixel.

16. A method of manufacturing a display device, the method comprising:
forming a driver electrically connected to a pixel,
wherein the forming the driver comprises:
forming an oxide semiconductor layer comprising a source area, a drain area, and a channel area disposed between the source area and the drain area on a substrate;
forming an insulating layer covering the oxide semiconductor layer;
forming a charge layer overlapping at least a portion of the channel area of the oxide semiconductor layer in a plan view in the insulating layer; and
forming a gate electrode disposed on the insulating layer and overlapping the channel area of the oxide semiconductor layer in a plan view.

17. The method of claim 16, wherein the forming the charge layer comprises injecting ions into the insulating layer using a mask.

18. The method of claim 17, wherein the injecting the ions comprises selectively injecting the ions into a portion of the insulating layer overlapping the channel area of the oxide semiconductor layer in a plan view and adjacent to the source area of the oxide semiconductor layer using the mask.

19. The method of claim 17, wherein an energy of the ions injected into the insulating layer ranges from 5 kV to 10 kV, and an injection amount of the ions injected into the insulating layer ranges from 3e11 ions/cm$^2$ to 3e12 ions/cm$^2$.

20. The method of claim 16, wherein the charge layer is formed such that the charge layer is spaced apart from the oxide semiconductor layer with a portion of the insulating layer interposed the charge layer and the oxide semiconductor layer.

* * * * *